US009285796B2

(12) United States Patent
Markov et al.

(10) Patent No.: US 9,285,796 B2
(45) Date of Patent: Mar. 15, 2016

(54) APPROXIMATE FUNCTIONAL MATCHING IN ELECTRONIC SYSTEMS

(71) Applicant: Synopsys, Inc., Mountain View, CA (US)

(72) Inventors: Igor L. Markov, Ann Arbor, MI (US); Kenneth S. McElvain, Los Altos, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/901,462

(22) Filed: May 23, 2013

(65) Prior Publication Data

US 2013/0254430 A1    Sep. 26, 2013

Related U.S. Application Data

(62) Division of application No. 12/204,777, filed on Sep. 4, 2008, now Pat. No. 8,453,084.

(51) Int. Cl.
*G06F 17/50* (2006.01)
*G05B 19/05* (2006.01)

(52) U.S. Cl.
CPC ............ *G05B 19/054* (2013.01); *G06F 17/505* (2013.01)

(58) Field of Classification Search
CPC . G06F 17/505; G06F 17/5045; G06F 17/509; G06F 11/3608; G06F 11/3612; G06F 11/3632; G06F 11/3636; G06F 11/3664; G06F 8/36; G06F 9/4428; G06F 9/465; G06F 9/54; G06F 9/547; Y10S 707/99931
USPC .................................................. 716/100–107
See application file for complete search history.

(56) References Cited

U.S. PATENT DOCUMENTS

| | | | |
|---|---|---|---|
| 4,495,619 A | 1/1985 | Acampora | |
| 5,596,576 A | 1/1997 | Milito | |
| 5,606,564 A | 2/1997 | Ho et al. | |
| 5,737,237 A | 4/1998 | Tanaka et al. | |
| 6,112,016 A | 8/2000 | MacWilliams et al. | |
| 6,148,433 A | 11/2000 | Chowdhary et al. | |
| 6,285,211 B1 | 9/2001 | Sample et al. | |
| 6,401,176 B1 | 6/2002 | Fadavi-Ardekani et al. | |
| 6,438,730 B1 | 8/2002 | Atmakuri et al. | |
| 6,457,159 B1* | 9/2002 | Yalcin et al. ................... | 716/104 |

(Continued)

FOREIGN PATENT DOCUMENTS

| TW | 200825735 | 6/2008 |
|---|---|---|
| WO | WO 2006/092792 A2 | 9/2006 |

OTHER PUBLICATIONS (DeHon) Kapre, Nachiket, et al, "Packet-Switched vs. Time-Multiplexed FPGA Overlay Networks," 14th Annual IEEE Symposium on Field-Programmable Custom Computing Machines, FCCM'06, 2006, 10 pages.

(Continued)

*Primary Examiner* — Binh Tat
(74) *Attorney, Agent, or Firm* — HIPLegalLLP; Judith Szepesi

(57) ABSTRACT

Methods and apparatuses for approximate functional matching are described including identifying functionally similar subsets of an integrated circuit design or software program, distinguishing control inputs of the subsets from data inputs, and assigning combinations of logic values to the input control signals to capture co-factors for functional matching.

23 Claims, 18 Drawing Sheets

(56) References Cited

U.S. PATENT DOCUMENTS

| | | | |
|---|---|---|---|
| 6,557,159 B1 | 4/2003 | Kutzschebauch et al. | |
| 6,560,761 B1 | 5/2003 | Yu et al. | |
| 6,735,712 B1 | 5/2004 | Maiyuran et al. | |
| 6,779,158 B2 | 8/2004 | Whitaker et al. | |
| 6,854,097 B2 | 2/2005 | Teig et al. | |
| 6,957,412 B1 | 10/2005 | Betz et al. | |
| 7,047,344 B2 | 5/2006 | Lou et al. | |
| 7,093,204 B2 | 8/2006 | Oktem et al. | |
| 7,200,822 B1 | 4/2007 | McElvain | |
| 7,305,586 B2 | 12/2007 | Doing et al. | |
| 7,337,418 B2 | 2/2008 | Kale et al. | |
| 7,414,426 B2 | 8/2008 | Cox et al. | |
| 8,141,024 B2 | 3/2012 | Markov et al. | |
| 2002/0109682 A1 | 8/2002 | Nash et al. | |
| 2003/0140324 A1* | 7/2003 | Yalcin et al. | 716/6 |
| 2004/0199887 A1 | 10/2004 | Jain et al. | |
| 2005/0229142 A1 | 10/2005 | Boppana et al. | |
| 2006/0149927 A1 | 7/2006 | Dagan et al. | |
| 2006/0265685 A1 | 11/2006 | Oktem et al. | |
| 2007/0005942 A1 | 1/2007 | Vinitzky et al. | |
| 2007/0126465 A1 | 6/2007 | Cox et al. | |
| 2007/0174794 A1 | 7/2007 | Oktem et al. | |
| 2008/0115100 A1 | 5/2008 | Vinitzky et al. | |
| 2008/0155508 A1 | 6/2008 | Sarkar et al. | |
| 2008/0216032 A1* | 9/2008 | McElvain et al. | 716/5 |
| 2009/0044159 A1 | 2/2009 | Vinitzky et al. | |
| 2010/0058298 A1 | 3/2010 | Markov et al. | |

OTHER PUBLICATIONS

Anand Raghunathan et al., "SCALP: An Iterative-Improvement-Based Low-Power Data Path Synthesis System", IEEE Transactions on Computer-Aided Design of Integrated Circuits and Systems, vol. 16, No. 11, Nov. 1997, pp. 1260-1277.

Bryant, et al., "Verification of arithmetic circuits using binary moment diagrams," *Int'l Journal of Software Tools for Technology Transfer*, 3(2), 21 pgs., May 2001.

Bushnell, et al., "Essentials of Electronic Testing for Digital, Memory and Mixed-Signal VLSI Circuits," *Springer*, 2005, ISBN 0-7923-7991-8. Table of Contents only, 9 pgs.

Chakradhar, Srimat T, et al, "Redundancy Removal and Test Generation for Circuits with Non-Boolean Primitives," In: 13th IEEE VLSI Test Symposium, pp. 12-19, 1995.

Choi, Sang Ho, et al, "Fast Logic Minimization Algorithm for Programmable-Logic-Array Design, Journal of the Korean Institute of Electronics Engineers," vol. 22, No. 2, pp. 25-30, 1985.

Corazao, Miguel R, et al, "Performance Optimization Using Template Mapping for Datapath-Intensive High-Level Synthesis," IEEE Tran. on computer-aided design of integrated circuits and systems, vol. 15, No. 8, pp. 877-888, Aug. 1996.

Dave, et al., "802.11a Transmitter: A Case Study in Michroarchitectural Exploration," *MEMOCODE* 2006, 10 pgs.

EE Times Europe, "Startup's Software Turns Uniprocessors Into Multicores," <www.electronics-eetimes.com/_includes/print.php?lg=en&cmp_id=17&safe_mode=>, Apr. 2, 2007, 2 pages.

Flores, Paulo, "An Exact Algorithm for the Maximal Sharing of Partial Terms in Multiple Constant Multiplications," Intl. Conference on Computing Aided Design, ICCAD 2005, Nov. 6-10, 2005, 4 pages.

<http://www.mplicity.com/products01.html>, "Products—The Hannibal Tool", date prior to the filing of this application, pp. 1-3.

<http://www.mplicity.com/products02.html>, "Products—Genghis-Khan Tool", date prior to the filing of this application, pp. 1-4.

<http://www.mplicity.com/technology.html>, "Technology—CoreUpGrade Overview", date prior to the filing of this application, pp. 1-2.

<http://www.mplicity.com/technology02.html>, "Technology—CoreUpGrade Tools", date prior to the filing of this application, pp. 1-2.

<http://www.mplicity.com/technology03.html>, "Technology—Cost Reduction", date prior to the filing of this application, pp. 1 total.

<http://www.mplicity.com/technology04.html>, "Technology—Performance Enhancement", date prior to the filing of this application, pp. 1 total.

<http://www.mplicity.com/technology05.html>, "Technology—CoreUpGrade for a Processor Core", date prior to the filing of this application, pp. 1-2.

Jason Cong et al., "Pattern-Based Behavior Synthesis for FPGA Resource Reduction", FPGA '08, Monterey, California, Copyright 2008, ACM, Feb. 24-26, 2008, pp. 10 total.

Laura Pozzi et al., "Exact and Approximate Algorithms for the Extension of Embedded Processor Instruction Sets", IEEE Transactions on Computer-Aided Design of Integrated Circuits and Systems, vol. 25, No. 7, Jul. 2006, pp. 1209-1229.

Leiserson, et al., "Retiming Synchronous Circuitry," *Algorithmica* 6(1), pp. 5-35, 1991.

M. Ciesielski et al., "Data-Flow Transformations using Taylor Expansion Diagrams", 2007 EDAADesign, Automation & amp; Test in Europe Conference & amp; Exhibition, 2007, pp. 6 total.

Mishchenko, et al., "Improvements to Combinational Equivalence Checking," *ICCAD* 2006, 8 pgs.

Ng, et al, "From WiFI to WiMAX: Techniques for IP Reuse Across Different OFDM Protocols," *MEMOCODE* 2007, 10 pgs.

Nicholas Weaver et al., "Post Placement C-Slow Retiming for Xilinx Virtex FPGAs", U.C. Berkeley Reconfigurable Architectures, Systems, and Software (BRASS) Group, ACM Symposium on Field Programmable Gate Arrays (GPGA) Feb. 2003, <http://www.cs.berkeley.edu/~nweaver/cslow.html>, pp. 1-24.

Nicholas Weaver et al., "Post-Placement C-slow Retiming for the Xilinx Virtex FPGA", FPGA '03, Feb. 23-25, 2003 Monterey California, pp. 10 total.

Parhi, Keshab K, "VLSI Digital Signal Processing Systems: Design and Implementation", Wiley-Interscience, 1999, Chapter 4 Retiming, pp. 91-118.

PCT/US2009/051770, International Preliminary Report on Patentability, Date of Issue Mar. 8, 2011, 5 pages.

PCT/US2009/051770, International Search Report and Written Opinion, dated Mar. 11, 2010, 10 pages.

Peter Tummeltshammer et al., "Time-Multiplexed Multiple-Constant Multiplication", IEEE Transactions on Computer-Aided Design of Integrated Circuits and Systems, vol. 26, No. 9, Sep. 2007, pp. 1551-1563.

Shekhar, et al., "Equivalence Verification of Polynomial Datapaths using Ideal Membership Testing," *IEEE Trans. on CAD* 26(7), 11 pgs., Jul. 2007.

Soha Hassoun et al., "Regularity Extraction Via Clan-Based Structural Circuit Decomposition", <http://www.eecs.tufts.edu/~soha/research/papers/iccad99.pdf>, 1999, pp. 5 total.

Srinivasa R. Arikati et al., A Signature Based Approach to Regularity Extraction, Copyright 1997, IEEE, 1092-3152/97, pp. 542-545.

Steve Trimberger et al., "A Time-Multiplexed FPGA", Copyright 1997, IEEE, 0-8186-8159-4/97, pp. 22-28.

Steve Trimberger, "Scheduling Designs into a Time-Multiplexed FPGA", FPGA 98 Monterey, CA USA Copyright 1998, ACM 0-89791-978-5/98, pp. 153-160.

Thorton, James E, "Parallel Operations in the Control Data 6600", AFIPS Proceedings FJCC, Part 2, vol. 26, 1964, pp. 1-11.

Verma, Ajay K, "Improved Use of the Carry-Save Representation for the Synthesis of Complex Arithmetic Circuits," Intl. Conference on Computing Aided Design, ICCAD 2005, Nov. 7-11, 2005, 8 pages.

Wei Zhang et al., "Nature: A Hybrid Nanotube/CMOS Dynamically Reconfigurable Architecture", 41.1 DAC 2006, Jul. 24-28, 2006, San Francisco, California, Copyright 2006 ACM 1-59593-381-6/06/0007, pp. 711-716.

Xiaoyong Chen et al., "Fast Identification of Custom Instructions for Extensible Processors", IEEE Transactions on Computer-Aided Design of Integrated Circuits and Systems, vol. 26, No. 2, Feb. 2007, pp. 359-368.

(56) References Cited

OTHER PUBLICATIONS

Y. Markovskiy et al., "C-slow Retiming of a Microprocessor Core" CS252 U.C. Berkeley Semester Project, date prior to the filing of this application, pp. 37 total.

Zaretsky, David C, et al, "Dynamic Template Generation for Resource Sharing in Control and Data Flow Graphs," In: VLSI Design, 2006, Conference on Embedded Systems and Design, Jan. 2006.

Zhang, et al., "NATURE: A Hybrid nanotube/CMOS Dynamically Reconfigurable Architecture," *DAC* 2006, pp. 711-716.

Taiwan Application No. 098125727 Office Action and Search Report, including translation mailed Jun. 6, 2014, 15 pages.

\* cited by examiner

Set $S_1 = 0$

Set $S_1 = 1$

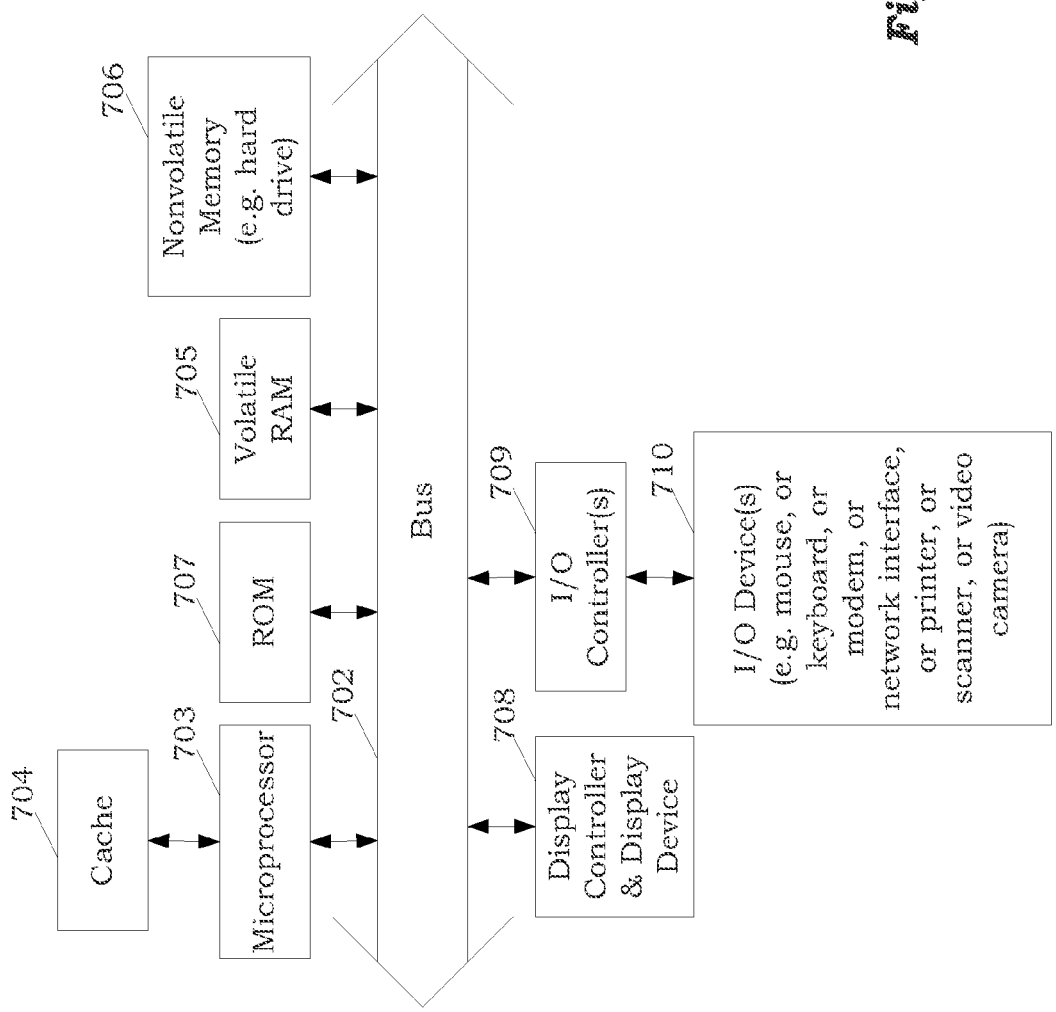

APPROXIMATE FUNCTIONAL MATCHING IN ELECTRONIC SYSTEMS

This application is a divisional of U.S. patent application Ser. No. 12/204,777, filed on Sep. 4, 2008, now U.S. Pat. No. 8,453,084, issuing on May 28, 2013.

FIELD OF THE INVENTION

The invention relates generally to matching techniques for electronic systems and software programs.

BACKGROUND OF THE INVENTION

Matching techniques are often used to optimize integrated circuit designs or software programs to reduce power consumption, area and cost, or to increase performance such as operating frequency and/or data throughput. Such matching techniques have been shown to be useful in several fields including high-level synthesis of digital logic and compilers for software programs. Integrated circuits and other electronic systems include binary logic or other hardware structures to perform the functions that each circuit was designed to achieve. Likewise, compilers for software programs include data structures to perform the functions that the program was designed to achieve.

Generally, matching techniques are applied to either the structures or the functions of integrated circuit designs and software programs. Structural matching techniques seek to identify separate structures within the design of an integrated circuit or software program and to combine those structures, to the extent possible, into a single structure or subset of structures that perform the same overall function as each of the separate structures individually or the same function as all structures together. Functional matching techniques, on the other hand, seek to identify separate functions within the design of an integrated circuit or a software program and combine those functions into a single function or subset of functions that perform the same overall function as each of the separate functions individually or the same function as all structures together.

This combining of structures and/or functions may be referred to as resource sharing. FIG. 1 illustrates resource sharing among modules with identical circuitry and/or functionality according to the prior art. FIG. 1 includes two identical circuits and/or functional modules, clone A 101 and clone B 102, having the same I/O signals, $IN_0$ and $OUT_0$, respectively. Since clone A 101 and clone B 102 contain identical circuitry and/or functionality and the same I/O, clone A 101 and clone B 102 are identified as candidates for sharing. Thus, clone A 101 and clone B 102 each includes identical circuitry and/or functionality that may be shared by both clone A 101 and clone B 102. This sharing of resources among identical circuits and/or functions is achieved by replacing clone A 101 and clone B 102 with a single shared resource 103 and appropriately routing the common I/O. The structure and/or functionality of both clone A 101 and clone B 102 is maintained, but the resources required by the circuit are reduced through resource sharing.

Integrated circuit designs and/or software programs include various structures to perform various functions. These structures may include different structures that perform different functions, similar structures that perform identical functions, identical structures that perform identical functions, and different structures that perform identical functions. Likewise, integrated circuit designs and/or software programs may include identical functions implemented using identical structures, identical functions implemented using similar or different structures, different functions implemented using similar structures, and different functions implemented using different structures.

The goal of matching techniques is to identify structures and/or functionality in an integrated circuit design or software program that can be matched to enable resource sharing to the extent possible. However, previously known techniques are limited to either exact matching or matching in terms of design descriptions, leaving some matches undetected. Conventional matching techniques have been limited to either exact functional matching, or exact and approximate structural matching. For example, the 2008 publication by J. Cong and W. Jiang entitled "Pattern-based Behavior Synthesis for FPGA Resource Reduction," Proc. ACM/SIGDA International Symposium on Field Programmable Gate Arrays (FPGA 2008) performs only structural matching techniques. The Cong publication finds bridging points of certain graphs to perform structural matching of integrated circuit hardware.

Several precursors of the Cong publication are also limited to structural matching including the following: L. Pozzi, K. Atasu, P. Ienne, "Exact and Approximate Algorithms for the Extension of Embedded Processor Instruction Sets," IEEE Trans. on CAD 25(7), July 2006; X. Chen, D. L. Maskell, Y. Sun, "Fast Identification of Custom Instructions for Extensible Processors," IEEE Trans. on CAD 26(2), February 2007; M. R. Corazao, M. Khalaf, L. Guerra, M. Potkonjak and J. M. Rabaey, "Performance Optimization Using Template Matching for Datapath-Intensive High-Level Synthesis," IEEE Trans. on CAD 15(8), August 1996, and A. Raghunathan and N. K. Jha, "SCALP: An Iterative-Improvement Based Low-Power Data Path Synthesis System," IEEE Trans. on CAD 16(11), November 1997.

In the category of functional matching, the recent publication by M. Ciesielski, S. Askar, D. Gomez-Prado, J. Guillot, E. Boutillon, entitled "Data-Flow Transformations using Taylor Expansion Diagrams," Proc. ACM/IEEE Design Automation Conference (DAC) 2007, performs exact functional matching only. Likewise, the publication by P. Tummeltshammer, J. C. Hoe, M. Pueschel, entitled "Time-Multiplexed Multiple-Constant Multiplication," IEEE TCAD 26(9), September 2007 is based on exact functional matching. The Tummeltshammer publication is applicable only to subsets of designs that perform multiplication by pre-determined constants, and only in the context of multiplication circuits. An earlier publication by P. Flores, J. Monteiro, E. Costa, entitled "An Exact Algorithm for the Maximal Sharing of Partial Terms in Multiple Constant Multiplications", Proc. ACM/IEEE Int'l Conf. on CAD (ICCAD 2005) on sharing resources among multiplication circuits exhibits the same limitations as Ciesielski and Tummeltshammer. The publication by A. Verma and P. Ienne entitled, "Improved use of the carry-save representation for the synthesis of complex arithmetic circuits," in Proceedings of ICCAD 2007 discloses a representation of arithmetic circuits that facilitates algorithms for exact functional matching. Similar techniques based on circuit transformations have been pursued in more recent art, but generally share the same limitations.

In the case of functional matching, it is well-known that designs that perform the same function, regardless of their internal structure, can be functionally matched to enable resource sharing. In the case of structural mapping, identical or similar structures may be matched whether or not they perform identical functions.

Another line of prior art is motivated by techniques that have been proposed for specialized physical layout of datapath circuits, exemplified by the U.S. Pat. No. 5,737,237 entitled "Method and apparatus for data path circuit layout design and memory medium for causing computer to execute datapath design," and U.S. Pat. No. 6,560,761 entitled "Method of datapath cell placement for bitwise and non-bitwise integrated circuits." These techniques teach receiving as input a datapath description for a datapath block and either prepare or receive function macros in each of which there is a defined expansion to a circuit comprising a plurality of schematic leaf cells. These techniques are commonly described for gate-level circuits.

In practice, datapath circuits can and often are extracted by design engineers. Since datapaths circuits (particularly adders and multipliers) may admit compact and regular layout, attempts have been made at "regularity extraction," often focusing on array-like structures and repeated components. S. Hassoun and C. McCreary in their ICCAD 1999 paper entitled, "Regularity extraction via clan-based structural circuit decomposition," points out that identifying repeating structural regularities in circuits allows the minimization of synthesis, optimization and layout efforts. They term these repeated structures "templates" and cover the circuit with an appropriate set of templates. U.S. Pat. No. 6,148,433 entitled, "Systematic approach for regularity extraction," also teaches generating a set of templates for a circuit through computer automated operations on a description of the circuit. The method includes covering the circuit with instances of a subset of the templates. Such templates may include adders, multipliers, and larger configurations.

S. R. Arikati and R. Varadarajan in their ICCAD 1997 paper entitled, "A signature based approach to regularity extraction," computes numerical signatures of circuit components and identifies similar components when different signatures match. U.S. Pat. No. 6,557,159 entitled, "Method for preserving regularity during logic synthesis," also determines a group of elements in a circuit netlist having similar regularity signatures. In this case, regularity is determined based on a physical layout of the circuit. Further, this patent teaches determining a regularity signature for each element within the group and determining whether the regularity signatures for each element are identical.

U.S. Pat. No. 7,337,418 entitled, "Structural regularity extraction and floorplanning in datapath circuits using vectors," distinguishes a functional regularity extraction component, a structural regularity extraction component, and a floorplanning component. Some embodiments of the functional regularity extraction component automatically generate a set of templates to cover a circuit. The templates generated by the functional regularity extraction component are used by a structural regularity extraction component. While particularly noting regularity in datapath circuits and focusing on templates, this patent also teaches identifying control logic for the logic design and excluding the control logic from the set of vectors. A vector is a group of template instances that are identical in function and in structure. The techniques described in this patent are structural as they consider two subgraphs functionally equivalent, if and only if the following: (a) if they are isomorphic' (b) the logic functions of corresponding nodes are the same; and (c) the indices of corresponding edges are also the same. Under this criterion, the functional equivalence of (a+b)*c and (a*c+b*c), even though obvious to a person skilled in the art, cannot be established. While focusing on template covering and physical layout, the patent does not explain how one may identify control or datapath.

SUMMARY OF THE DESCRIPTION

Embodiments described herein include a method and computer-readable medium to perform a method, the method comprising locating one or more subsets of an integrated an integrated circuit or software program with similar functionality and/or subsets with functionality similar to a given template, assigning combinations of logic values to the control inputs of the subsets to capture a plurality of co-factors performed by the subsets for each of the combinations of logic values, and performing functional matching using the plurality of captured co-factors.

BRIEF DESCRIPTION OF THE DRAWINGS

A better understanding of at least certain embodiments of the invention can be obtained from the following detailed description in conjunction with the following drawings, in which:

FIG. 7 illustrates an exemplary data processing system upon which the methods and apparatuses of the invention may be implemented.

DETAILED DESCRIPTION

Figure 1:
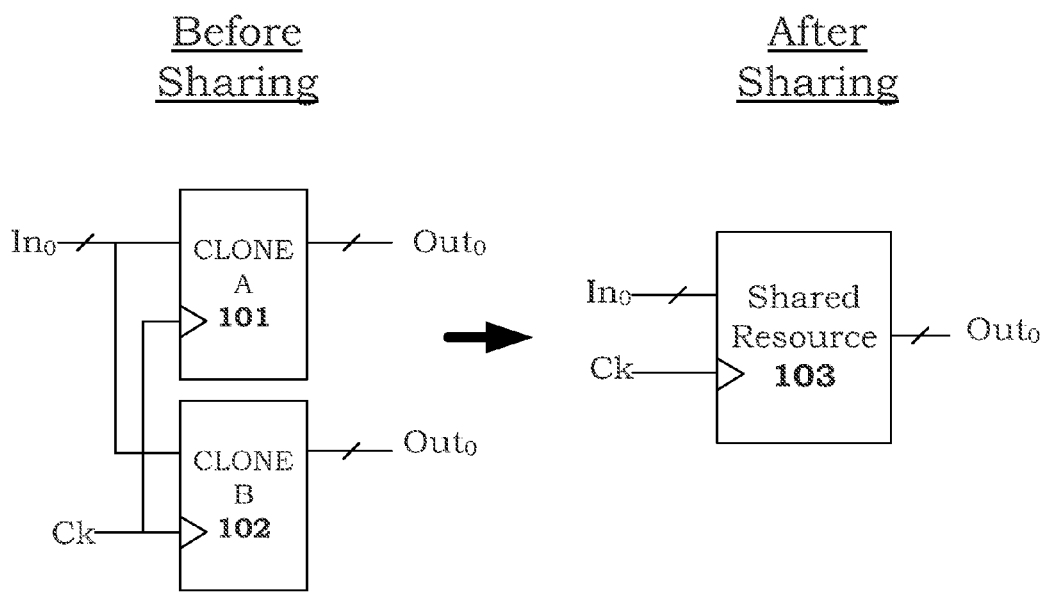
FIG. 1 illustrates resource sharing among modules with identical circuitry and/or functionality according to the prior art.

Throughout the description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form to avoid obscuring the underlying principles of embodiments of the present invention.

A method and apparatus for approximate functional matching in electronic systems is described. At least certain embodiments identify approximate functional matches not found by previously existing techniques. These embodiments simultaneously remove the restrictions of exact functional matching and structural matching taught in the prior art by matching one or more subsets of an integrated circuit design or software program (hereinafter referred to collectively as "subsets") to one or more templates, or by matching two or more subsets to each other. Some embodiments match subsets with different descriptions but very similar function, without requiring the function to be identical. This can be done by analyzing a description of an integrated circuit design or software program looking for subsets with similar function and/or subsets whose function is similar to a given template. In both cases, the structural descriptions of the subsets may be unrelated, or unrelated to the structural descriptions of the given templates. The matched subsets need not be exact (or identical to each other), but may differ in various respects.

Embodiments first consider one or more subsets of an integrated circuit design or software program with similar function and/or subsets whose function is similar to a given template. Embodiments then identify control inputs in the subsets and/or templates, or read an already prepared description identifying the control inputs. In the former case, embodiments evaluate the impact of assigning logic values to a given input. If this impact is deemed significant, the input is labeled as a control input (several criteria can be used to determine significant impact, e.g., if some other inputs are made irrelevant or if the support of some outputs changes significantly).

The identified control inputs are then used in certain embodiments to capture a plurality of co-factors (or special-case functions). By separating the overall function of a subset into a plurality (such as an ordered set or vector) of such co-factors, embodiments can leverage other functional matching techniques, including known techniques for exact functional matching. In at least certain embodiments, this process is referred to as approximate functional matching, since functional matching may be performed on matching candidates (subsets) with similar, but not exact functionality. If multiple or all co-factors match for two or more subsets or for one or more subsets and a template, then an approximate match is declared. An approximate match is also an exact match if for every control-input combination the co-factors match. In this way, embodiments can locate approximate functional matches not found by prior art solutions. This can lead to a multitude of benefits in various applications, including better utilization of available resources, smaller chip size, smaller manufacturing cost, and smaller power consumption.

I. First Criterion for Identifying Control Signals

In at least certain embodiments, control signals must be distinguished from data signals. Word-level and Boolean decision diagrams can be combined to represent datapaths and control, using hybrid decision diagrams or by adding ROBDD-like multiplexor nodes to word-level decision diagrams. Either way, data must first be distinguished from control. Control signals generally appear in the middle of a circuit after data comparisons, and can be clustered into multibit control values. In one embodiment, inputs may be evaluated using two criteria. The first criterion is to perform constant propagation on a given input to compare sets of internal signals made unobservable. That is, control signals may be identified by independently propagating binary values of 0 and 1 through inputs of an integrated circuit or software program to simplify the resulting netlist. If constant propagation of binary values of 0 and 1 substantially impacts the resulting circuit or program, the signal may be considered control. However, there is no hard and fast rule as to what criteria may be used to determine whether an input is data or control as several criteria may be used independently or in combination with each other including whether the input values activate very different regions of the design, if other inputs are made irrelevant by combinations of the input values, or if the support of some output changes substantially, to name a few. The determination of control signals may vary from implementation to implementation. What is determined to be control in one circuit or program may be determined to be data in another. These judgments may be implementation specific based on various factors including the type of circuit or program as well as individualized needs of users and/or administrators.

Figure 2A:
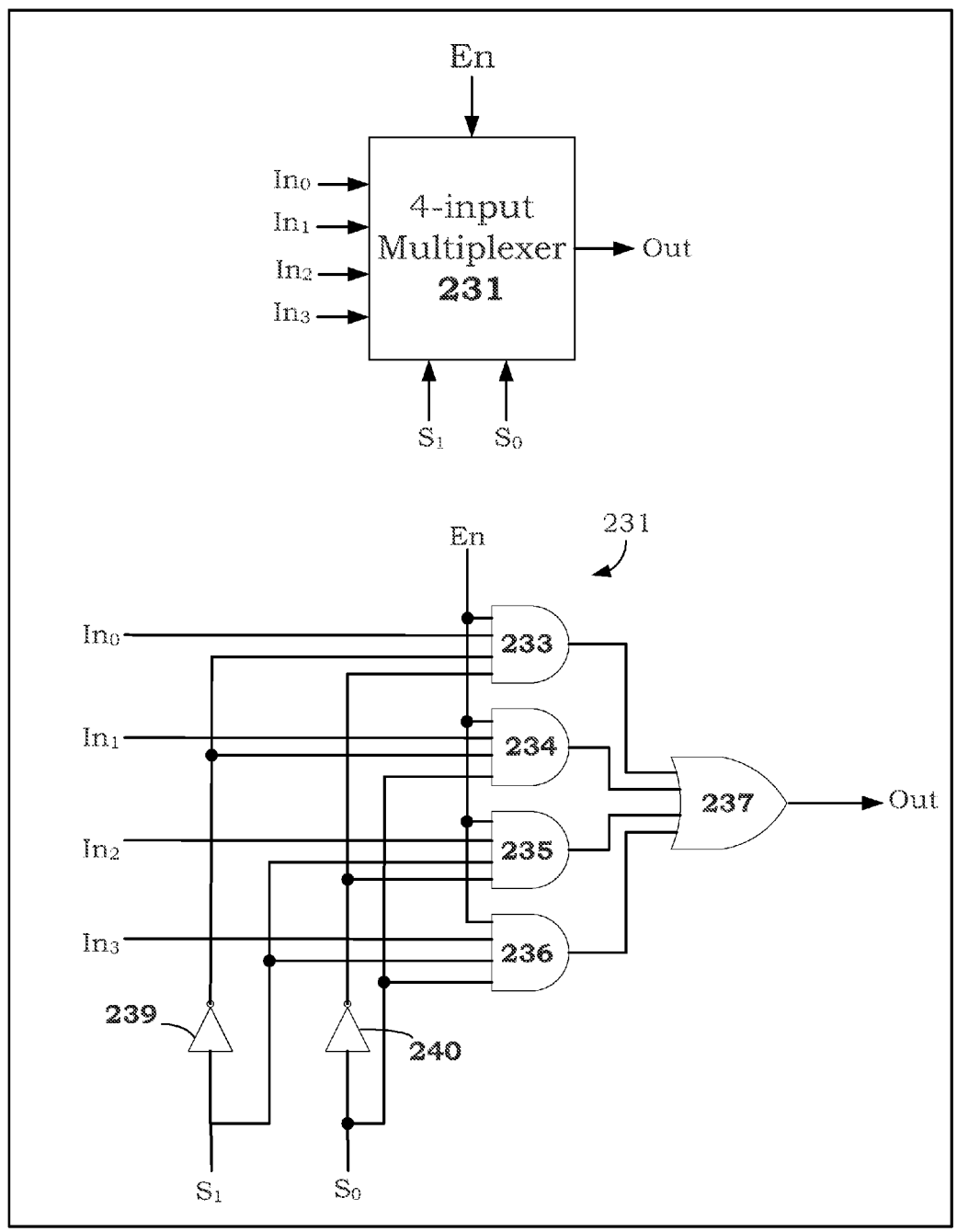
FIG. 2A illustrates an implementation of a 4-input multiplexor circuit.

For example, an explicit multiplexor is a well-known circuit configuration containing control circuitry. FIG. 2A illustrates an implementation of a 4-input multiplexor circuit. 4-input multiplexor circuit 231 includes inputs $In_0$, $In_1$, $In_2$, $In_3$, En (enable), $S_0$, and $S_1$. The internal logic of 4-input multiplexor 231 is illustrated at the bottom portion of FIG. 2A including inverters 239-240, AND gates 233-236, and OR gate 237. The equation represented by 4-input multiplexor 231 is as follows:

$$Out = En \cdot [(In_0 S_1' S_0') \text{ OR } (In_1 S_1' S_0) \text{ OR } (In_2 S_1 S_0') \text{ OR } (In_3 S_1 S_0)]$$

Figure 2B:
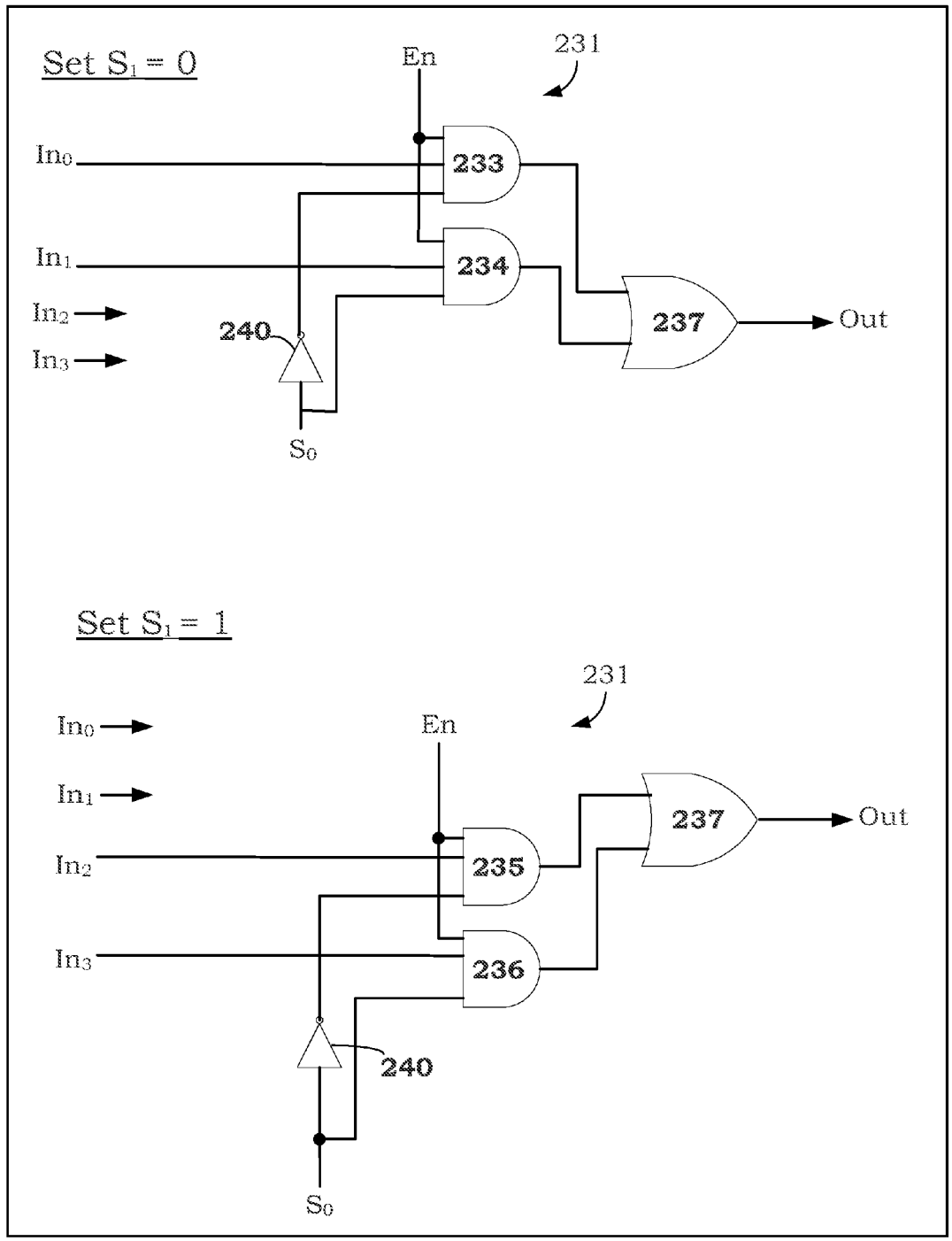
FIG. 2B illustrates special-case circuits (co-factors) resulting from propagating constant binary values of 0 and 1 into an input of a 4-input multiplexor according to an exemplary embodiment of the invention.

Control inputs may be identified by determining the impact of the resulting netlist when constant propagation of the binary values of 0 and 1 is applied to the inputs. FIG. 2B illustrates special-case circuits (co-factors) resulting from propagating constant binary values of 0 and 1 into an input of a 4-input multiplexor according to an exemplary embodiment of the invention. In the illustrated embodiment, when $S_1$ is set $=0$, circuit 231 reduces to the simple AND-OR circuit shown at the top portion of FIG. 2B including only inverter 240, AND gates 235-236, and OR gate 237. This can be seen by setting $S_1=0$ in the above equation resulting in the equation:

$$Out = En \cdot [(In_0 \cdot 1 \cdot S_0') \text{ OR } (In_1 \cdot 1 \cdot S_0) \text{ OR } (In_2 \cdot 0 \cdot S_0') \text{ OR } (In_3 \cdot 0 \cdot S_0)]$$

which simplifies to, $$Out = En \cdot [(In_0 \cdot 1 \cdot S_0') \text{ OR } (In_1 \cdot 1 \cdot S_0)].$$

With reference to the circuit elements of FIG. 2A, whenever input $S_1$ is set $=0$, the value 0 is propagated to inverter 239, and AND gates 235-236. Inverter 239 will always output a 1 when input S1 is set $=0$, therefore inverter 239 is removed and a value of 1 is propagated to AND gates 233 and 234.

Whenever an AND function is applied to "anything" and the value 1, the "anything" is propagated to the output. Since the output of inverter 239 is equal to the value of 1, the AND gate 233 and 234 may be simplified into 3-input AND gates. The output of AND gate 233 will always be the AND of inputs $In_0$, En, and $S_0'$. Therefore, the constant propagation of the value of 0 at input $S_1$ results in reducing circuit 231 as illustrated in the top portion of FIG. 2B. Likewise, the constant propagation of the value of 1 at input $S_1$ results in reducing circuit 231 as illustrated in the lower portion of FIG. 2B.

In at least certain embodiments, the impact of the applying the above constant propagation on inputs of an integrated circuit or computer program is determined. If this impact is deemed significant enough, the input is determined to be a control input. Otherwise, the input is determined to be data. In previous computer implemented methodologies, signals were always classified as either data or control signals with no overlap. In contrast, embodiments provide a spectrum of signal classifications with some signals being classified as definitely control signals, definitely data signals, or anywhere in-between. Inputs may then be determined to be more control than data. Likewise, inputs may be determined to be more data than control. As discussed above, in some embodiments this determination may be made based on the impact of constant propagation of the binary values of 0 and 1 at inputs of an integrated circuit or software program, and subsequently judging the impact on the resulting circuit. Accordingly, embodiments envision signals that are almost determined to be data signals, but not quite. Likewise, embodiments envision signals that are almost determined to be control signal, but not quite.

Figure 2C:
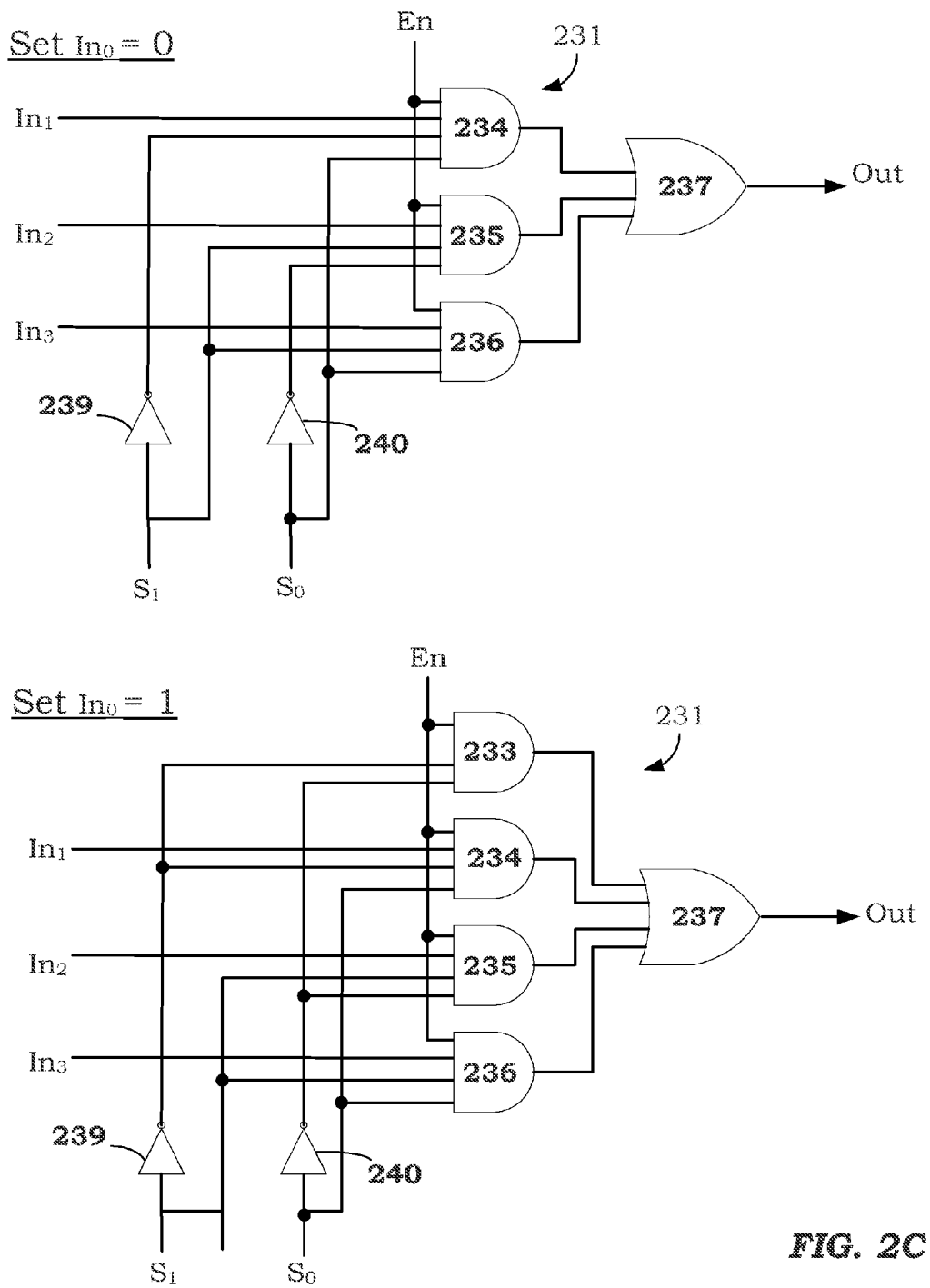
FIG. 2C illustrates special-case circuits (co-factors) resulting from propagating constant binary values of 0 and 1 into an input of a 4-input multiplexor according to an exemplary embodiment of the invention.

In the illustrated embodiment of FIGS. 2A and 2B, it is clear that applying constant propagation to the input $S_1$ substantially reduces the circuit 231. However, applying constant propagation to other inputs may result in only a minor or insubstantial impact on the resulting circuit 231. FIG. 2C illustrates special-case circuits (co-factors) resulting from propagating constant binary values of 0 and 1 into an input of a 4-input multiplexor according to an exemplary embodiment of the invention. In the illustrated embodiment, whenever $In_0$ is set =0, circuit 231 reduces slightly to the circuit illustrated at the top portion of FIG. 2C including inverters 239-240, AND gates 234-236, and OR gate 237. Likewise, the constant propagation of the value of 1 at input $In_0$ results in reducing circuit 231 as illustrated in the lower portion of FIG. 2B.

In this case, applying constant propagation of binary values 0 and 1 to input $In_0$ may be deemed (based on selected criteria discussed above) to reduce the logic of circuit 231 substantially less than applying constant propagation of binary values of 0 and 1 to input $S_1$. In at least certain embodiments, the impact of performing the above constant propagation on input $S_1$ may be deemed significant enough for $S_1$ to be determined to be a control signal rather than data, whereas the impact of performing constant propagation on input $In_0$ may be deemed too insubstantial for $In_0$ to be determined to be a control signal. However, as discussed above, different impacts on a particular circuit may be judged differently depending on any number of criteria discussed above including whether the input values activate very different regions of the design, if other inputs are made irrelevant by combinations of the input values, or if the support of some output changes substantially.

Figure 2D:
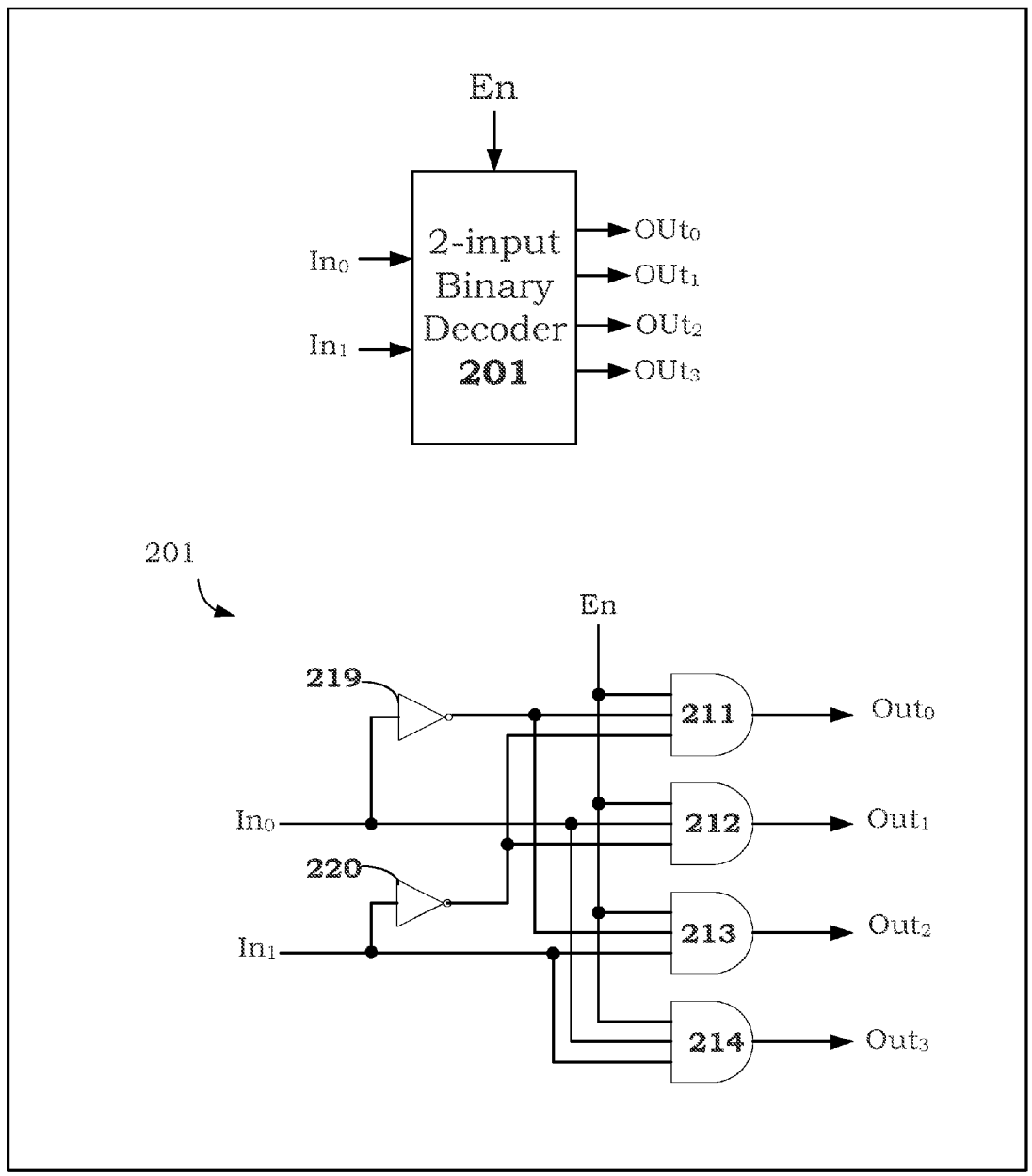
FIG. 2D illustrates an implementation of a 2-input binary decoder circuit.
Figure 2E:
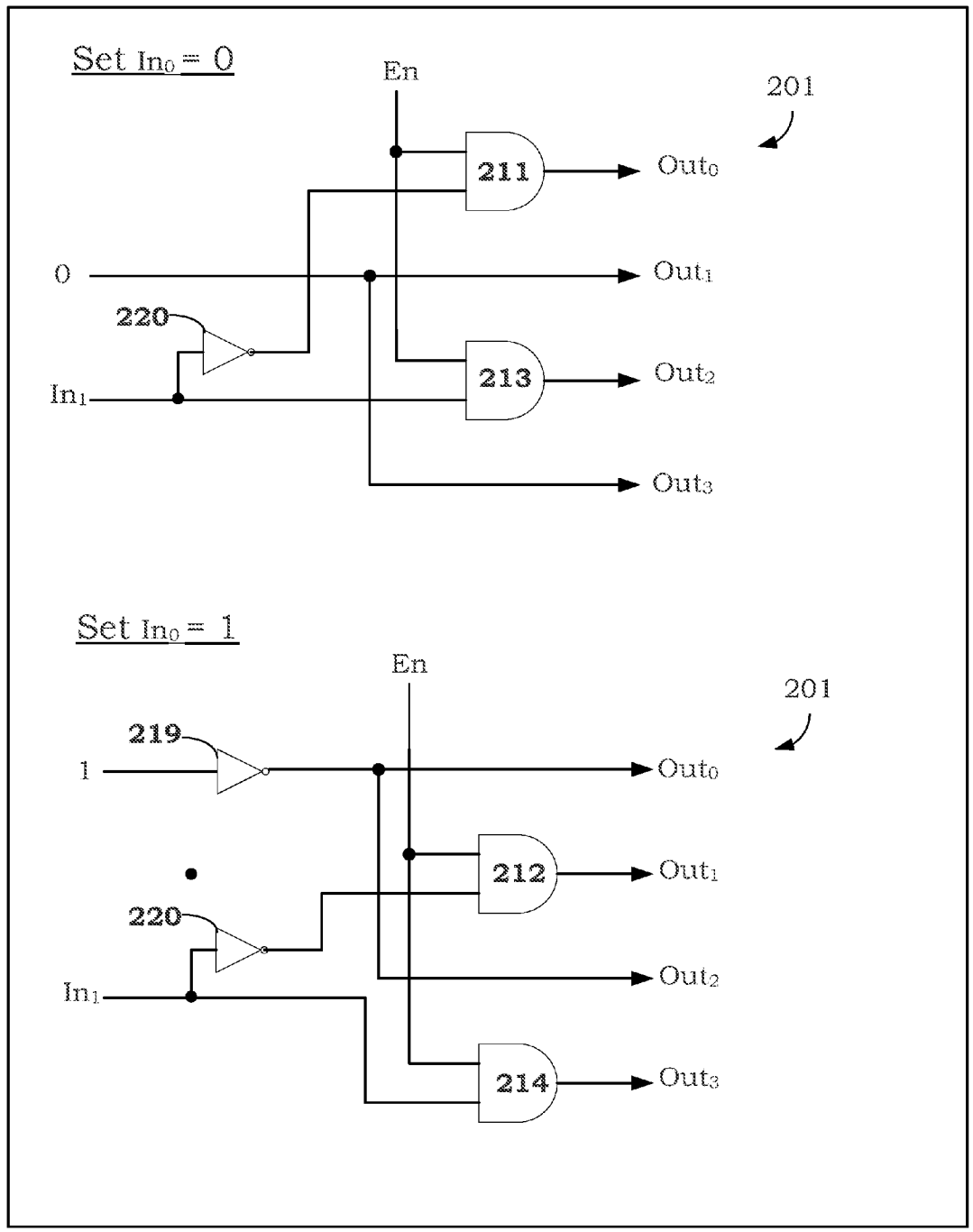
FIG. 2E illustrates special-case circuits (co-factors) resulting from propagating constant binary values of 0 and 1 into an input of a 2-input binary decoder circuit according to an exemplary embodiment of the invention.
Figure 2F:
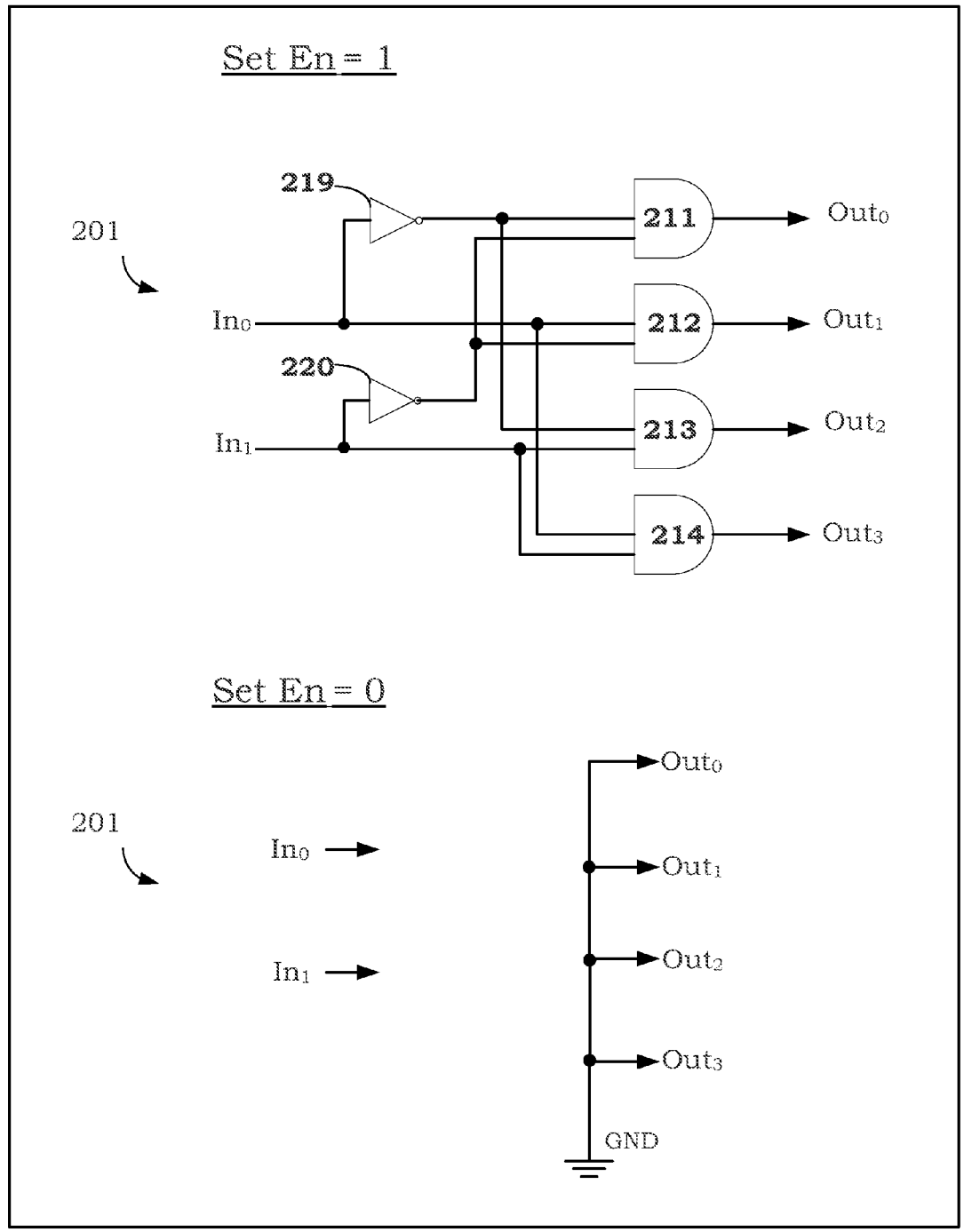
FIG. 2F illustrates special-case circuits (co-factors) resulting from propagating constant binary values of 0 and 1 into an input of a 2-input binary decoder circuit according to an exemplary embodiment of the invention

Another example is demonstrated in FIGS. 2D-2F. FIG. 2D illustrates an implementation of a 2-input binary decoder circuit. 2-input decoder 201 includes inputs $In_0$, $In_1$, En (enable) and outputs $Out_0$, $Out_1$, $Out_2$ and $Out_3$. The internal logic of 2-input decoder 201 is illustrated in the lower portion of FIG. 2D including inverters 219-220, and AND gates 211-214. The equations represented by 2-input decoder 201 are as follows:

$$Out_0 = In_1' \cdot In_0' \cdot En$$

$$Out_1 = In_1' \cdot In_0 \cdot En$$

$$Out_2 = In_1 \cdot In_0' \cdot En$$

$$Out_3 = In_1 \cdot In_0 \cdot En$$

In certain embodiments, control inputs may be identified by determining the impact of the resulting netlist when inputs are constant propagated with the binary values of 0 and 1. FIG. 2E illustrates special-case circuits (co-factors) resulting from propagating constant binary values of 0 and 1 into an input of a 2-input binary decoder circuit according to an exemplary embodiment of the invention. In the illustrated embodiment, whenever $In_0$ is set =0, circuit 201 reduces to the simple AND circuit shown at the top portion of FIG. 2E including only inverter 220, and AND gates 211 and 213. This can be seen by setting $In_0$ to 0 in the above equation resulting in the following equations:

$$Out_0 = In_1' \cdot 1 \cdot En$$

$$Out_1 = In_1' \cdot 0 \cdot En$$

$$Out_2 = In_1 \cdot 1 \cdot En$$

$$Out_3 = In_1 \cdot 0 \cdot En$$

which simplifies to, $$Out_0 = In_1' \cdot En$$

$$Out_1 = 0$$

$$Out_2 = In_1 \cdot En$$

$$Out_3 = 0$$

Likewise, the constant propagation of the value of 1 at input $In_0$ results in reducing circuit 201 as illustrated in the lower portion of FIG. 2E. In the illustrated embodiment of FIGS. 2D and 2E, it is not necessarily unambiguous that applying constant propagation to the input $In_0$ substantially reduces the circuit 201. However, applying constant propagation to other inputs may result in a substantial impact on the resulting circuit 201. FIG. 2F illustrates special-case circuits (co-factors) resulting from propagating constant binary values of 0 and 1 into an input of a 2-input binary decoder circuit according to an exemplary embodiment of the invention. In the illustrated embodiment, whenever En is set =1, circuit 201 reduces slightly to the circuit illustrated at the top portion of FIG. 2F including inverters 219-220 and AND gates 212 and 214. Thus, the impact of propagating the constant binary value of 1 to input En may be deemed insubstantial based on this result. In contrast, the constant propagation of the value of 1 at input En may be deemed to be substantial since it results in reducing circuit 201 as illustrated in the lower portion of FIG. 2F. In at least certain embodiments, therefore, input En may be determined to be a control signal rather than data based on the criteria discussed above since applying constant propagation of binary values 0 and 1 to input En reduces the logic of circuit 201 substantially more than applying constant propagation of values of 0 and 1 to input $In_0$. As a result, the impact of performing the above constant propagation on input En may be deemed significant enough for En to be labeled as a control signal rather than data, whereas the impact of performing constant propagation on input $In_0$ may be deemed too insubstantial for $In_0$ to be determined to be a control signal.

II. Second Criterion for Identifying Control Signals

Figure 3A:
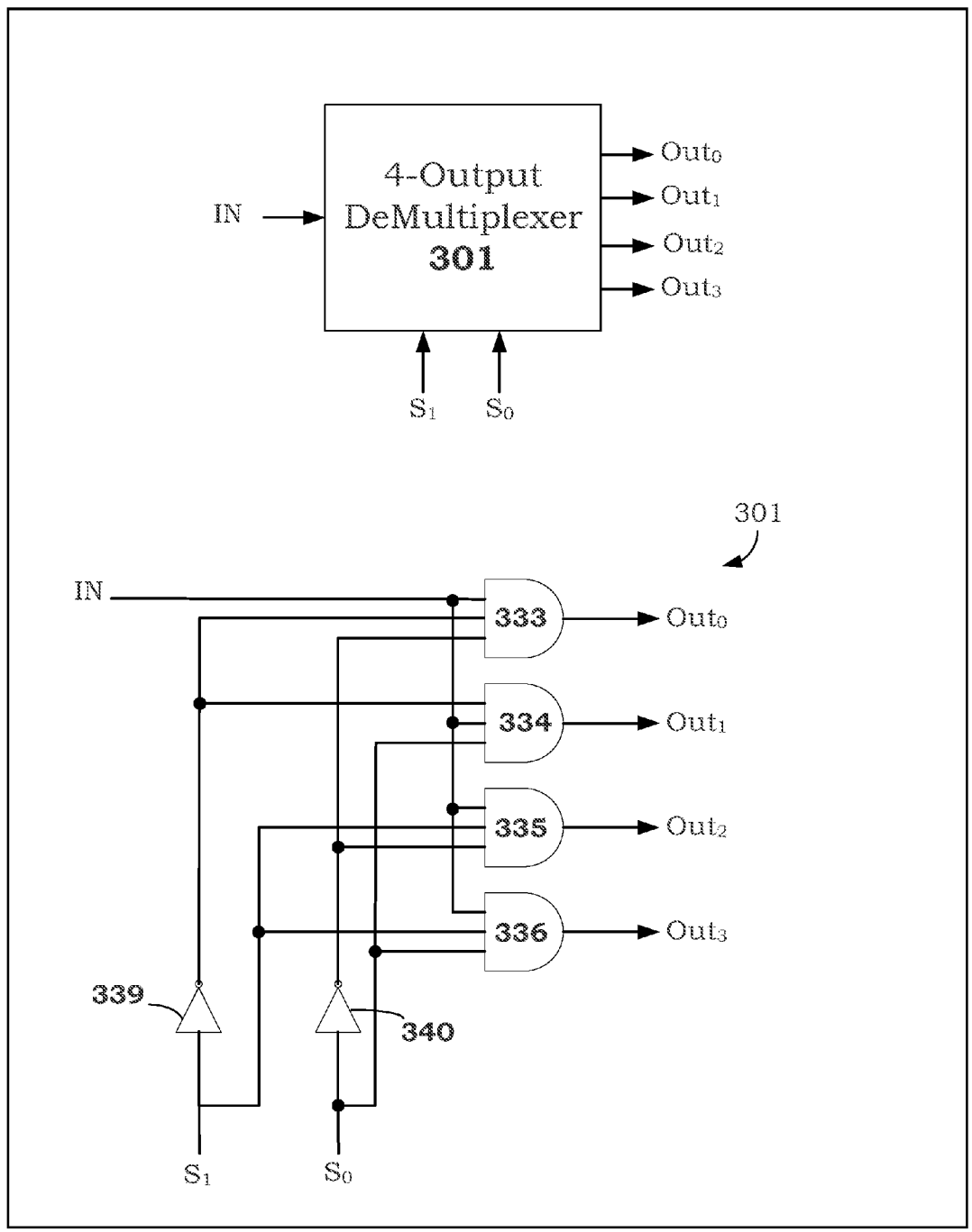
FIG. 3A illustrates an implementation of a 4-output demultiplexer circuit

Sometimes control inputs may not be determined based on the embodiments described above. In such cases, embodiments describe a second criterion which may be used to distinguish control signals form data signals. The second criterion is not mutually exclusive from the first criterion discussed above. The two criteria may either be performed independently and/or in conjunction with each other. An example of using the second criterion in conjunction with the first criterion is demonstrated in FIGS. 3A-3C. FIG. 3A illustrates an implementation of a 4-output demultiplexor circuit. 4-output demultiplexer 301 includes inputs $S_0$, and $S_1$, In, and outputs $Out_0$, $Out_1$, $Out_2$ and $Out_3$. The internal logic of 4-output demultiplexor 301 is illustrated in the lower portion of FIG. 3A including inverters 339-340 and AND gates 333-336. The equations represented by 4-output demultiplexor 201 are as follows:

$$Out_0 = S_1' \cdot S_0' \cdot IN$$

$$Out_1 = S_1' \cdot S_0 \cdot IN$$

$$Out_2 = S_1 \cdot S_0' \cdot IN$$

$$Out_3 = S_1 \cdot S_0 \cdot IN$$

Figure 3B:
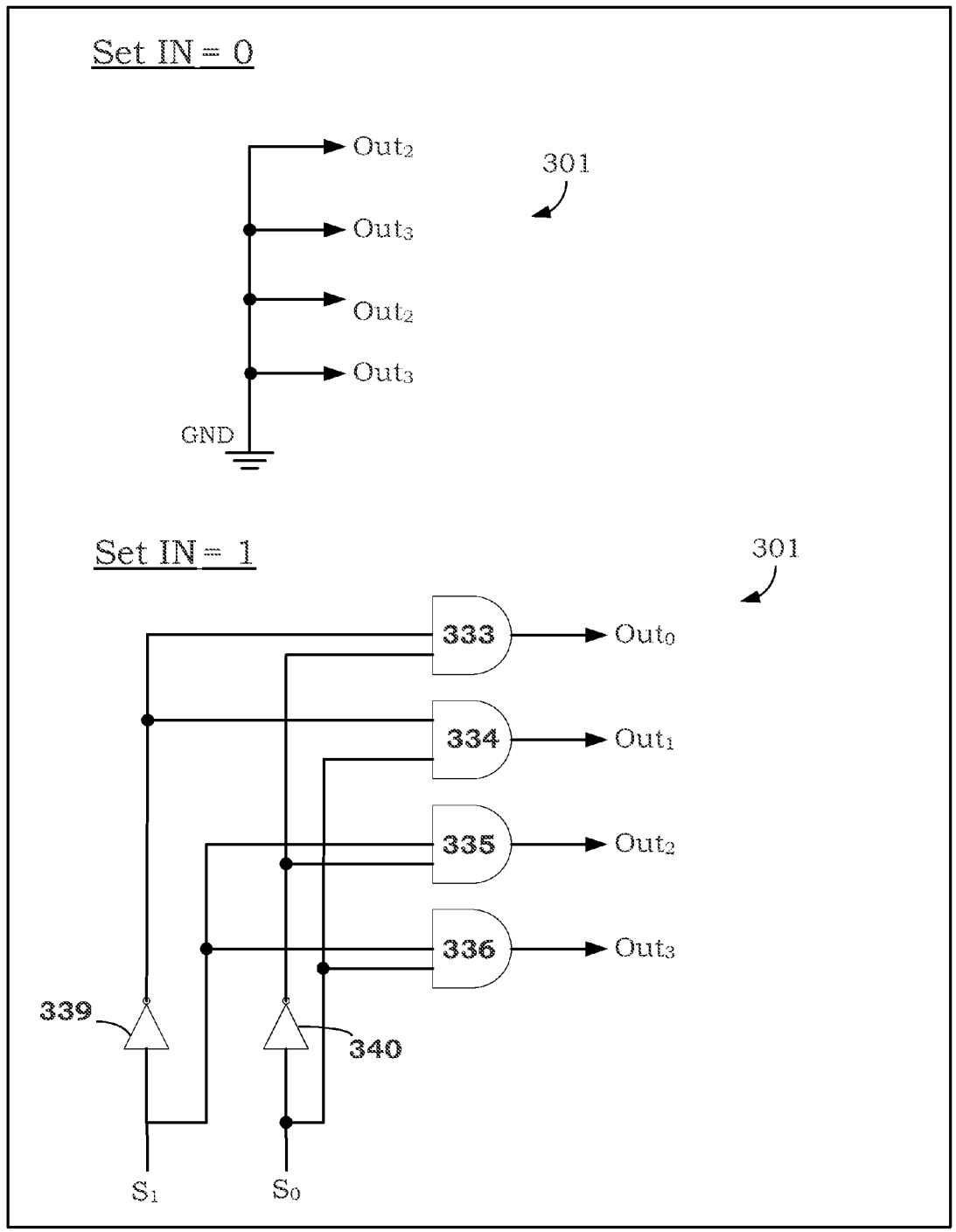
FIG. 3B illustrates special-case circuits (co-factors) resulting from propagating constant binary values of 0 and 1 into an input of a 4-output demultiplexer circuit according to an exemplary embodiment of the invention.

In certain embodiments, control inputs may not be identified by determining the impact of the resulting netlist when inputs are constant propagated with the binary values of 0 and 1. In this case, the first criterion may not correctly identify control inputs. FIG. 3B illustrates special-case circuits (cofactors) resulting from propagating constant binary values of 0 and 1 into an input of a 4-output demultiplexer circuit according to an exemplary embodiment of the invention. In the illustrated embodiment, whenever input IN is set =0, circuit 301 reduces to a simple ground (GND) circuit with all outputs tied to voltage ground (binary 0). This can be seen by setting In =0 in the above equation resulting in the following equations:

$$Out_0 = S_1' \cdot S_0' \cdot 0$$

$$Out_1 = S_1' \cdot S_0 \cdot 0$$

$$Out_2 = S_1 \cdot S_0' \cdot 0$$

$$Out_3 = S_1 \cdot S_0 \cdot 0$$

which simplifies to, $$Out_0 = 0$$

$$Out_1 = 0$$

$$Out_2 = 0$$

$$Out_3 = 0$$

Likewise, the constant propagation of the value of 1 at input IN results in reducing circuit 301 as illustrated in the lower portion of FIG. 3B. In the illustrated embodiment of FIG. 3B, the impact of applying constant propagation of the values of 0 and 1 to input IN may be considered ambiguous. In the top portion of FIG. 3B, setting IN =0 substantially simplifies the circuit 301, whereas in the lower portion of FIG. 3B, setting IN =1 hardly changes circuit 301 at all.

Figure 3C:
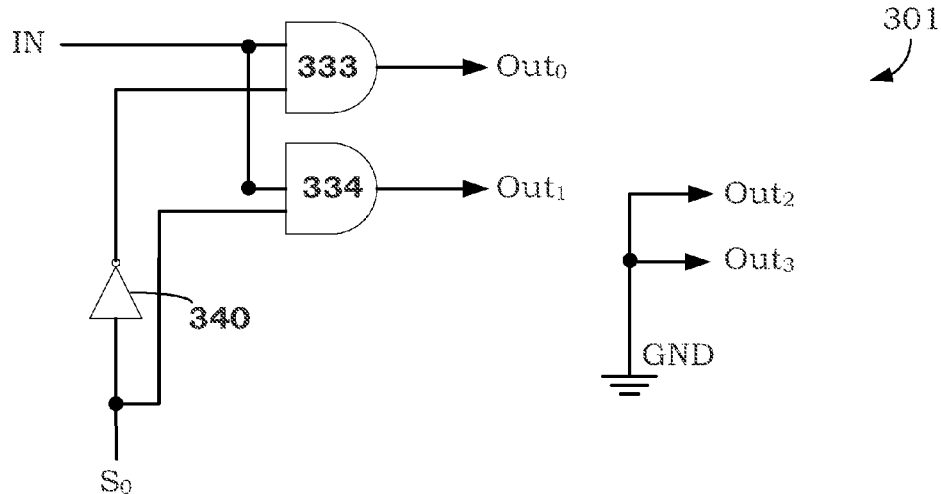
FIG. 3C illustrates special-case circuits (co-factors) resulting from propagating constant binary values of 0 and 1 into an input of a 4-output demultiplexer circuit according to an exemplary embodiment of the invention.
Figure 3C:
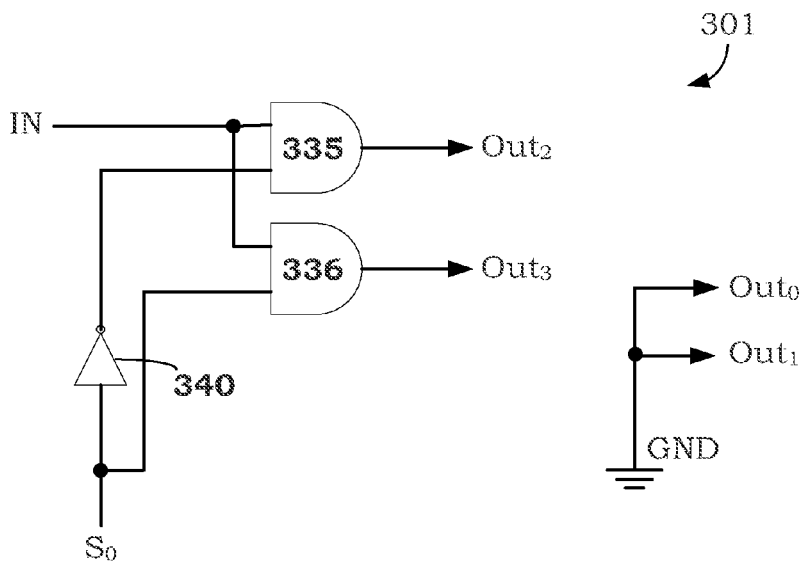

FIG. 3C illustrates special-case circuits (co-factors) resulting from propagating constant binary values of 0 and 1 into an input of a 4-output demultiplexer circuit according to an exemplary embodiment of the invention. In the illustrated embodiment, whenever input $S_1$ is set =0, circuit 301 is reduced to the circuit shown in the top portion of FIG. 3C. Likewise, the constant propagation of the value of 1 at input $S_1$ results in reducing circuit 301 as illustrated in the lower portion of FIG. 3C. In the illustrated embodiment of FIG. 3C, the impact of applying constant propagation of the values of 0 and 1 to input $S_1$ may be considered ambiguous. This is because propagating the constant binary values of 0 and 1 to input $S_1$ reduces circuit 301 somewhat. In at least certain embodiments, this impact may be deemed too insubstantial to be considered a control input.

In these cases, the first criterion may not correctly identify control inputs and the second criterion may be used. The second criterion determines the number of bit-signals controllable by a given input signal. That is, the second criterion determines the amount of outputs that are sensitized by a given input. An input sensitizes a given output whenever a logic transition at the input produces a logic transition at the given output for various configurations of side-inputs. To check each downstream signal, an SAT-based Boolean-difference computation or ATPG-style justification can be used. For example, referring back to FIG. 3A, the second criterion is applied to inputs X and $S_1$. When the second criterion is applied to input X, the side-inputs will be $S_1$ and $S_0$. The second criterion determines how many outputs are sensitized by a transition in X for given values of $S_1$ and $S_0$. The following table summarizes the results of a logic transition in X for each combination of values of $S_1$ and $S_0$:

TABLE 1.1 illustrates various outputs sensitized by input X.

| Assigned Values of $S_1$ | Assigned Values of $S_0$ | Outputs Sensitized by transition of X |
|---|---|---|
| 0 | 0 | $Out_0$ |
| 0 | 1 | $Out_1$ |
| 1 | 0 | $Out_2$ |
| 1 | 1 | $Out_3$ |

Table 1.1 illustrates various outputs sensitized by input X.

A transition in the logic value of X for each combination of $S_1$ and $S_0$ sensitizes at most only one (1) output as indicated by table 1.1 above. In at least certain embodiments, sensitizing only one output may not be considered significant enough to label X as a control signal. In such a case, the input X may be considered to be a data signal rather than a control signal.

When the second criterion is applied to input $S_1$, on the other hand, the side-inputs will be X and $S_0$. The second criterion determines how many outputs are sensitized by a transition in $S_1$ for given values of X and S0. The following table summarizes the results of a logic transition in $S_1$ for each combination of values of X and $S_0$:

TABLE 1.2 illustrates various outputs sensitized by input $S_1$.

| Assigned Values of $S_0$ | Assigned Values of X | Outputs Sensitized by transition of $S_1$ |
|---|---|---|
| 0 | 0 | None |
| 0 | 1 | $Out_0$, $Out_2$ |

TABLE 1.2-continued illustrates various outputs sensitized by input $S_1$.

| Assigned Values of $S_0$ | Assigned Values of X | Outputs Sensitized by transition of $S_1$ |
|---|---|---|
| 1 | 0 | None |
| 1 | 1 | $Out_1$, $Out_3$ |

Table 1.2 illustrates various outputs sensitized by input X. A transition in the logic value of $S_1$ for each combination of X and $S_0$ sensitizes as many as two (2) outputs as indicated by table 1.2 above. This is half of the total outputs in circuit 301, and in at least certain embodiments, sensitizing half of the outputs in a particular circuit may be considered significant enough to label $S_1$ as a control signal. As discussed above, however, there is no hard-and-fast rule, and whether a signal is determined to be control or data may vary from case to case.

In this manner, the second criterion may identify control signals not identified using the first criterion alone. This is particularly useful for identifying demultiplexors (such as circuit 301) and add/subtract control lines of adders/subtractors.

Figure 4A:
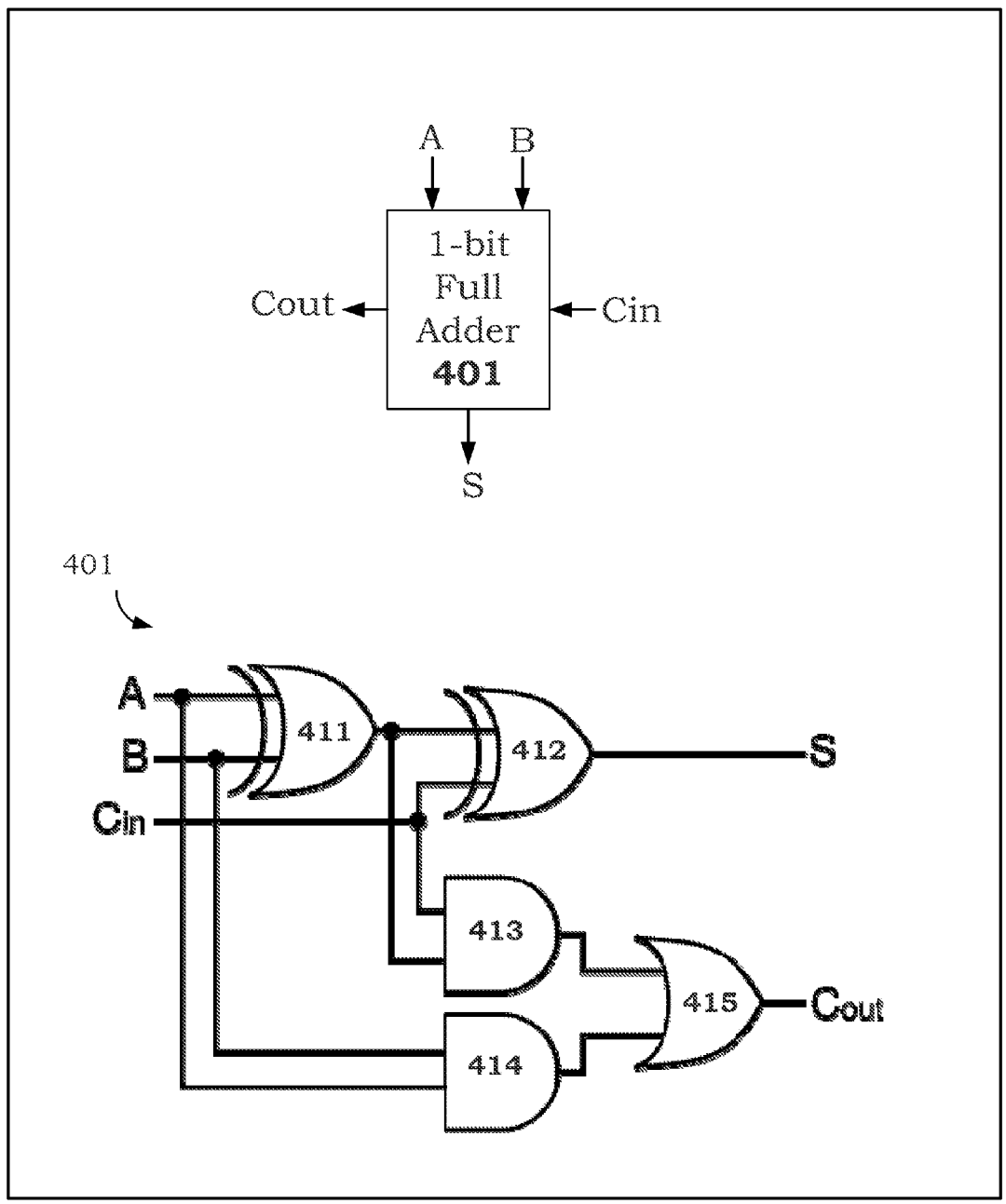
FIG. 4A illustrates an implementation of a 1-bit full adder circuit.

Other times ambiguous findings may result using both of the above methods. FIG. 4A illustrates an implementation of a 1-bit full adder circuit. 1-bit adder 401 includes inputs A, B and Cin, and outputs Cout and S (sum). The internal logic gates of 1-bit adder 301 are shown in the bottom portion of FIG. 4A including exclusive-OR (XOR) gates 411-412, AND-gates 413-414, and OR-gate 415. The equations represented by 1-bit adder 401 are as follows:

$$S = (A \text{ XOR } B) \text{ XOR } Cin$$

$$Cout = (A \cdot B) \text{ OR } (Cin \cdot (A \text{ XOR } B))$$

Figure 4B:
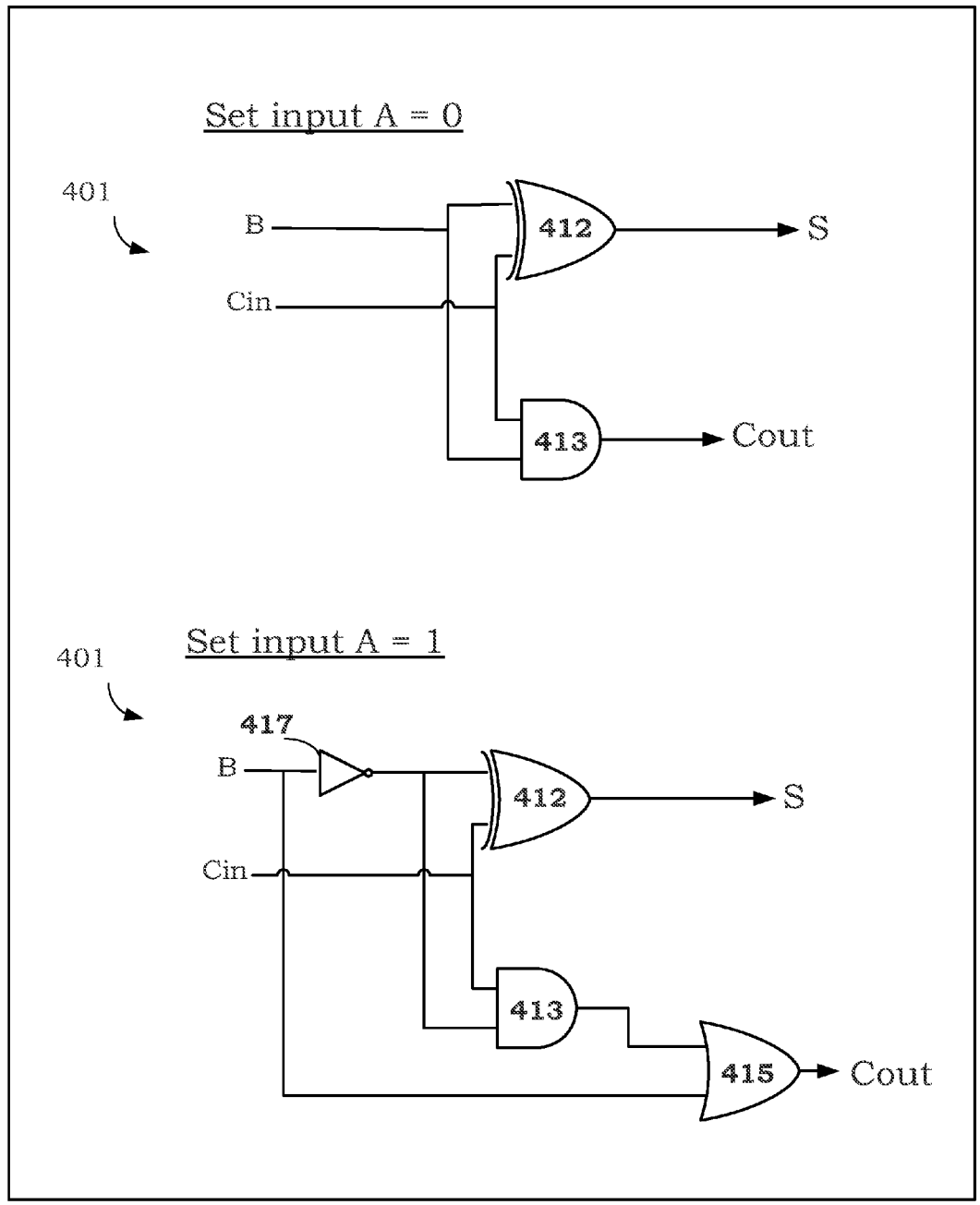
FIG. 4B illustrates special-case circuits (co-factors) resulting from propagating constant binary values of 0 and 1 into an input of a 1-bit full adder circuit according to an exemplary embodiment of the invention.

In these embodiments, however, control inputs may not be properly identified by determining the impact of the resulting netlist when inputs are constant propagated with the binary values of 0 and 1. Additionally, control inputs may not be properly identified by determining how many outputs are sensitized by a given input. FIG. 4B illustrates special-case circuits (co-factors) resulting from applying constant propagation of binary values 0 and 1 to an input of a 1-bit full adder circuit according to an exemplary embodiment of the invention. In the illustrated embodiment, when input A is set to 0, circuit 401 reduces to the half-adder circuit shown in the top portion of FIG. 4B including only XOR gate 412 and AND gate 413. The logic functions of XOR gate 411, AND gate 414, and OR gate 415 have been resolved by propagating the value 0 of input A. This can be seen by setting A=0 in the above equation resulting in the following equations:

$$S = (0 \text{ XOR } B) \text{ XOR } Cin$$

$$Cout = (0 \cdot B) \text{ OR } (Cin \cdot (0 \text{ XOR } B))$$

which simplifies to, $$S = B \text{ XOR } Cin$$

$$Cout = Cin \cdot B$$

This can also be seen by referring back to FIG. 4A. Whenever input A is set =0, the inputs of XOR 411 are 0 and B. Whenever the value of a first input to an XOR gate is =0, the output value will be equal to the value of the other input(s) to the XOR gate, in this case B. So, input B propagates through to the input of XOR 412. XOR 411 is removed. Likewise, when input A is set =0, the inputs of AND 414 are 0 and B. Thus, 0 propagates through to the input of OR gate 415, and AND gate 414 is removed. Now the inputs to OR gate 415 are the output of AND 413 and 0. Whenever a first input to a 2-input OR gate is a 0, then the output will be equal to the value of the other input(s). In this case the output of AND 413 is the other input of OR gate 415 and, therefore, the output of AND 413 propagates through to Cout. OR gate 415 is removed. The resulting circuit is shown in the top portion of FIG. 4B. Similarly, when input A is set =1, circuit 401 reduces to the circuit shown in the bottom portion of FIG. 4B including only XOR gate 412, AND gate 413, inverter 417 and OR gate 415. It is noted that XOR 211 reduces to inverter 417. The logic functions of XOR gate 411 and AND gate 414 have been resolved by propagating the value 1 into input A.

Figure 4C:
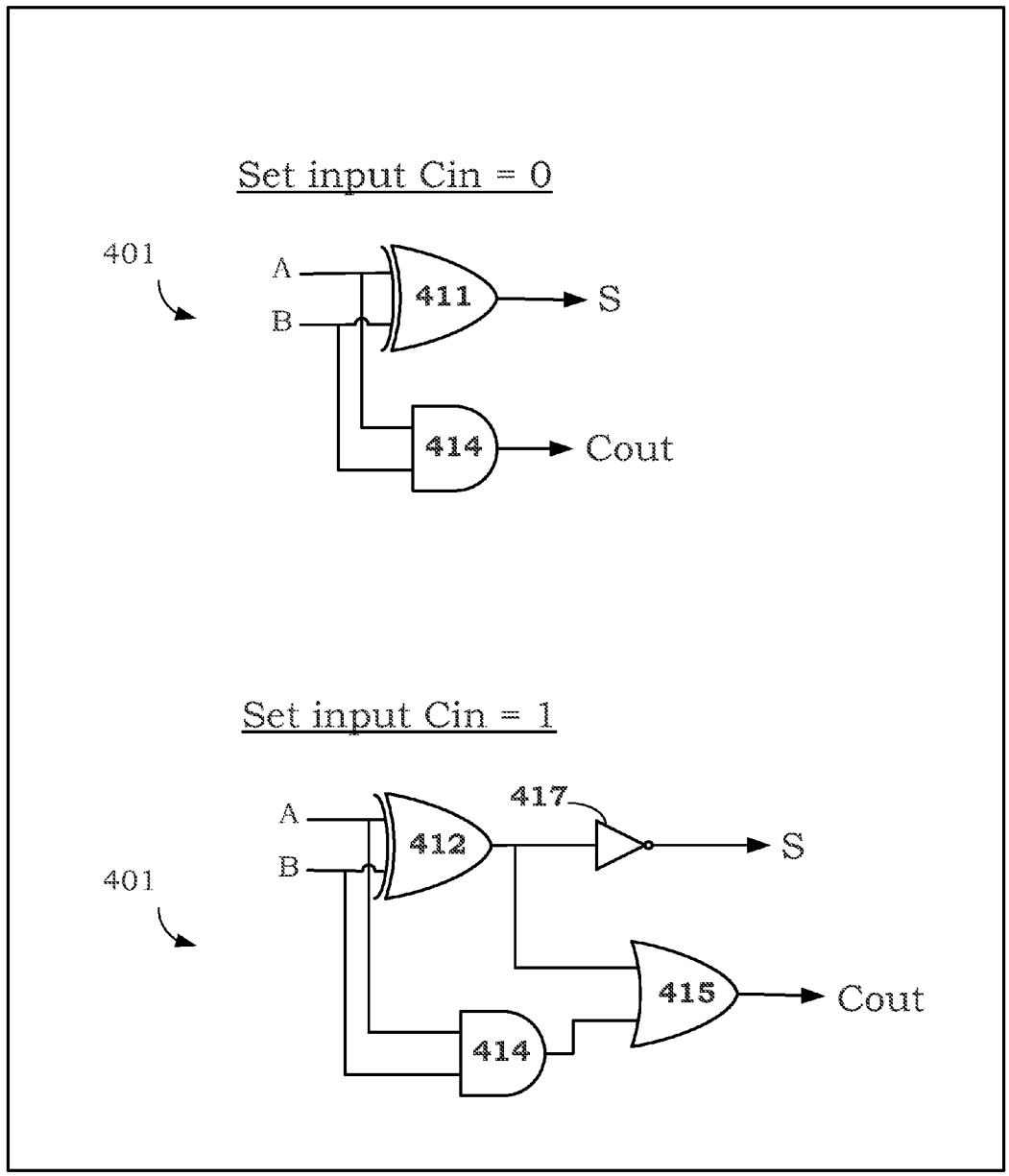
FIG. 4C illustrates special-case circuits (co-factors) resulting from propagating constant binary values of 0 and 1 into input Cin of a 1-bit full adder circuit according to an exemplary embodiment of the invention.

Similarly, FIG. 4C illustrates special-case circuits (co-factors) resulting from applying constant propagation of binary values 0 and 1 to input Cin of a 1-bit full adder circuit according to an exemplary embodiment of the invention. In the illustrated embodiment, when input Cin is set =0, circuit 401 reduces to the half-adder circuit shown in the top portion of FIG. 4C including only XOR gate 411 and AND gate 414. The logic functions of XOR gate 412, AND gate 413, and OR gate 415 have been resolved by propagating the value 0 of input Cin. When input Cin is set =1, circuit 401 reduces to the circuit shown in the bottom portion of FIG. 4B including only XOR gate 412, AND gate 413, inverter 417 and OR gate 415. It is noted that XOR 411 reduces to inverter 417. The logic functions of XOR gate 411 and AND gate 414 have been resolved by propagating the value 1 of input A.

In the case of 1-bit full adder circuit 401, the impact of propagating constant values of 0 and 1 into inputs A and Cin may be considered to have yielded ambiguous results. Performing constant propagation on inputs A and Cin both yielded reduced circuits with the same number of gates in both cases. This being the case, a decision as to whether each input A and Cin should be considered control or data may be tough to determine. In at least certain embodiments, this may be resolved by evaluating the inputs A and Cin using the second criterion of determining how many outputs are sensitized by a given input may be performed. However, the second criterion also may be considered to yield ambiguous results. For example, referring again to FIG. 4A, whenever input A of 1-bit full adder 401 is in a logic transition for various combinations of B and Cin, outputs S and Cout are both sensitized. Likewise, whenever input Cin is in a logic transition for various combinations of A and B, outputs S and Cout are also both sensitized.

Figure 4D:
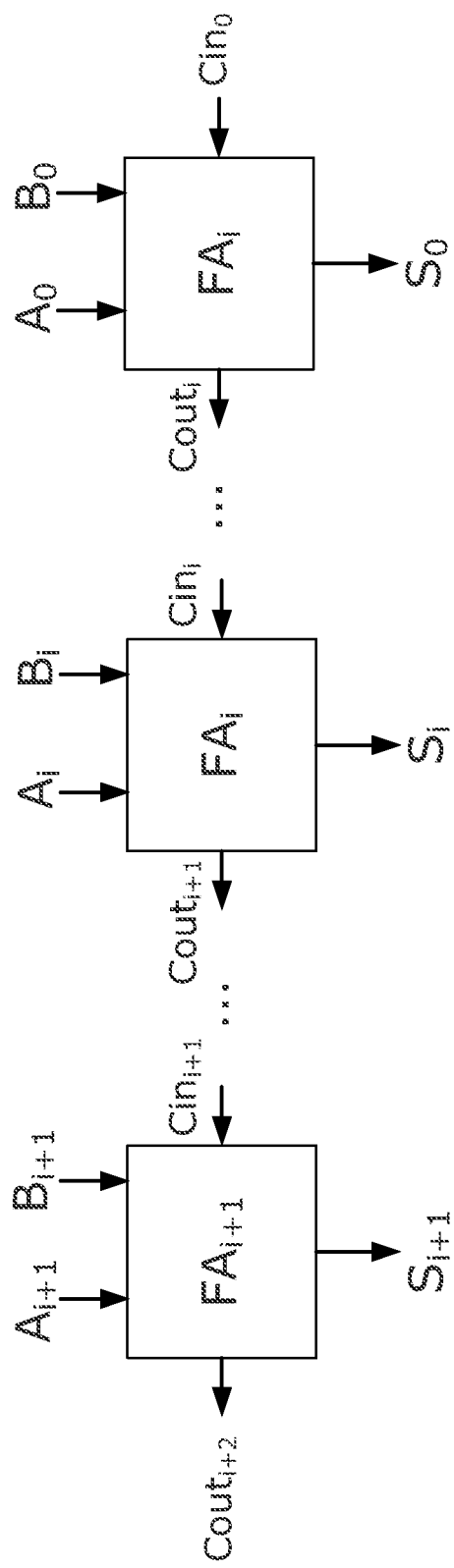
FIG. 4D illustrates an implementation of a carry-ripple adder.

Thus, under both the first and second criterion, the results may be considered ambiguous depending on the particular implementation of the 1-bit full adder 401. In such a case, it may be difficult to determine if inputs A and Cin are control signals or data. However, both A and Cin may sensitize fewer or more outputs in a chain of 1-bit full adder circuits. Typically, 1-bit adders are configured in combination with other 1-bit adders in order to perform multi-bit additions and/or subtractions. FIG. 4D illustrates an implementation of a carry-ripple adder. Adder modules can be implemented in several ways, which differ in structure, cost and speed (delay). A "carry-ripple" adder module is a multilevel network formed by the connection of 1-bit adders, called "full-adders", as illustrated in FIG. 4D. The full-adder modules perform addition of a pair of input bits (such as inputs A and B) and a carry input (such as input Cin), producing a sum bit (S) and a carry output (Cout). That is, the inputs to full-adder i are bits $A_i$ and $B_i$ from the input vector, and a carry input, $Cin_i$ coming from full-adder i−1. As output, full-adder i produces the sum bit $S_i$ and the carry-out bit $Cout_{i+1}$ (which is connected as carry input to full-adder i+1).

In the illustrated embodiment, it is clear that the carry-in input Cin sensitizes substantially more outputs along the carry chain than the inputs A or B to any one of the full-adders. Thus, although looking at the 1-bit adder configuration standing alone, it may be ambiguous whether inputs A, B and Cin represent data or control. However, when considering a multilevel implementation, such as the carry-ripple adder of FIG. 4D formed by the chain of 1-bit full adders 401, it may become clear that Cin is more closely akin to a control input than a data input based on the total number of outputs sensitized by the carry chain. It also may become clear that inputs A and B are more closely akin to data inputs rather than control based on the number of outputs sensitized by the inputs A and B. Accordingly, in at least certain embodiments, input Cin may be identified as a control signal by viewing the input in light of the entire multilevel implementation of the 1-bit full-adder circuit using the second criterion. Likewise, inputs A and B may be identified as data signals by viewing the inputs in light of the entire multilevel implementation of the 1-bit full-adder circuit using the second criterion.

Figure 5A:
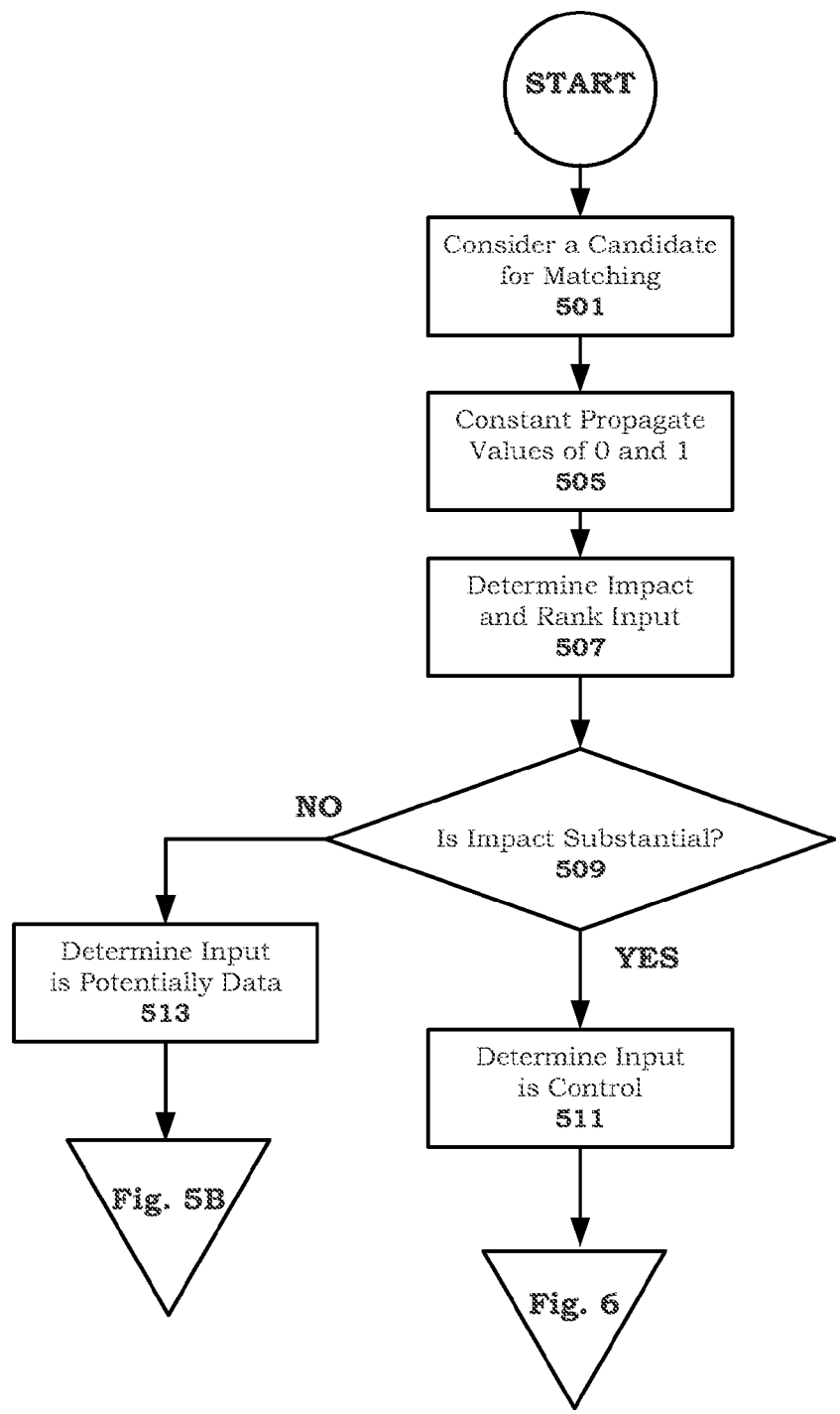
FIG. 5A illustrates a method for determining control inputs in an integrated circuit design or software program according to an exemplary embodiment of the invention.

A method for determining control inputs in an integrated circuit design or software program according to an exemplary embodiment of the invention is illustrated in FIG. 5A. The method begins by considering various candidates for matching in an integrated circuit design or software program (operation 501). This can be done in at least certain embodiments by searching for and locating subsets with similar function and/or subsets whose function is similar to a given template. In both cases, structural descriptions of the subsets may be unrelated, or unrelated to the structural descriptions of the given templates. Constant binary values of 0 and 1 are then propagated into the inputs of the identified candidates (operation 505) and the impact of the constant propagation is determined and the input is ranked with respect to other inputs (operation 507). In the illustrated embodiment, control flows to decision block 509 where it is determined whether the impact of the constant propagation is substantial enough to label the input as a control signal. As discussed previously, whether the impact of constant propagation is substantial may be relative to the particular case as implementations vary widely. If the impact of the constant propagation is considered substantial, the input is determined to be control (operation 511) and control flows to FIG. 6. If the impact of the constant propagation is not considered substantial, the potential arises that the input could be classified as data (operation 513) and control flows to FIG. 5B where the second criterion is applied to the input.

Figure 5B:
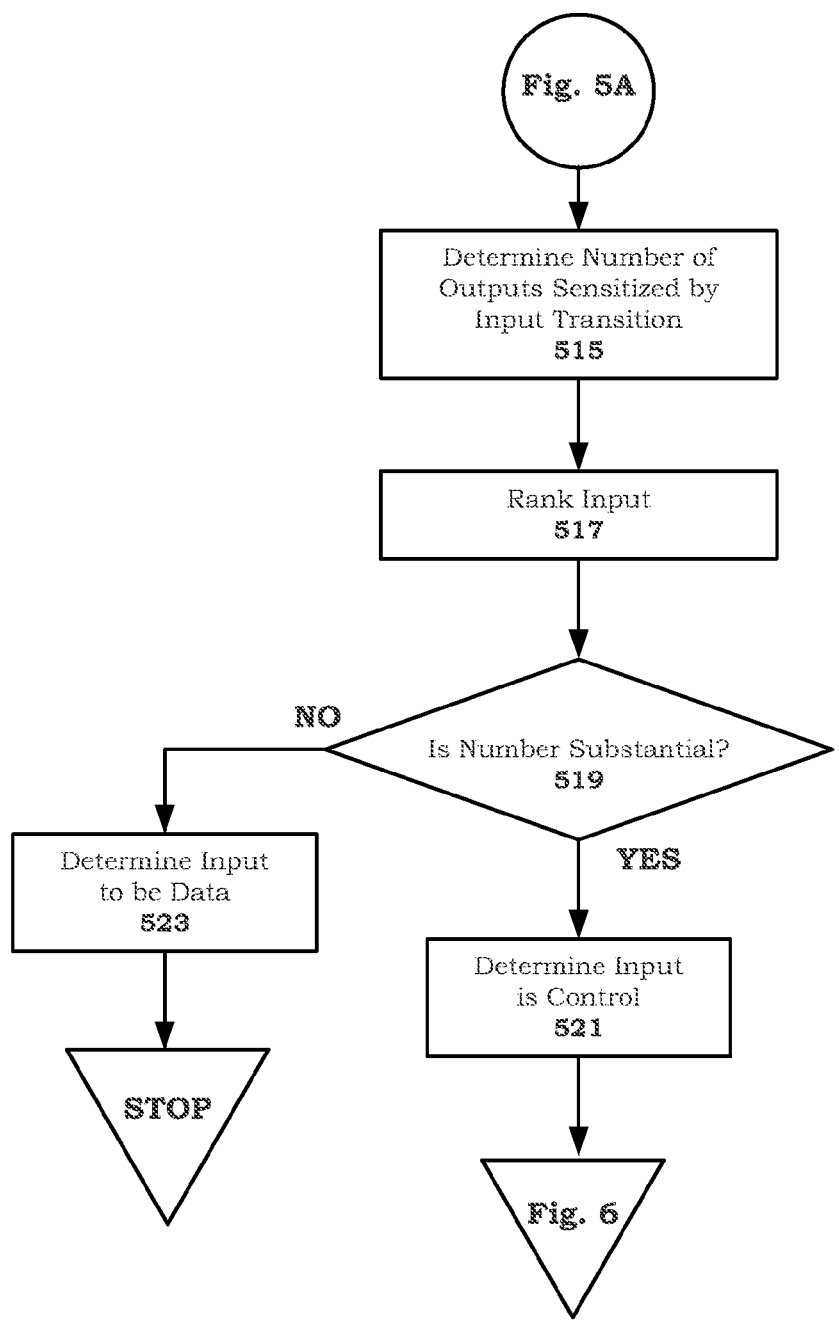
FIG. 5B illustrates a method for determining control inputs in an integrated circuit design or software program according to an exemplary embodiment of the invention.

FIG. 5B illustrates a method for determining control inputs in an integrated circuit design or software program according to an exemplary embodiment of the invention. In certain cases, control signals may not properly be identified using the first criterion (method in FIG. 5A), and so, the second criterion may be applied. The number of outputs sensitized by a logic transition of an input in question is first determined (operation 515) and ranked (operation 517). For each combination of side-inputs, the number of outputs sensitized (i.e., potentially making a logic transition) for each combination of side-inputs is determined. If this number is considered substantial (operation 519), the input may determined to be a control input (operation 521). If this number of sensitized outputs is determined to be insubstantial, then the input may be determined to be data (operation 523). This completes the method of FIGS. 5A-5B.

III. Approximate Functional Matching

With control inputs known and ranked, various combinations of the control inputs may be applied to the identified control signals to reduce the integrated circuit or software program to a subset that can be matched to templates and/or other subsets using known matching techniques. Using the control rankings, a small subset of control signals is found and all possible combinations of the subset of control signals is considered. A series of co-factors may then be captured by toggling combinations of values of the control inputs. Specifically, for a known control input set, the function performed by the circuit or software program may be captured by assigning various combinations of logic values to the control inputs. Each combination of control inputs assigned may reduce the circuit or software program. For each combination, the reduced circuit or software program is captured as a co-factor (special-case function), which may be represented as a plurality (ordered set or vector) of co-factors, each corresponding to a particular combination of values assigned to the control inputs.

Thus, in embodiments, control inputs are first identified using the first criterion and/or the second criterion discussed above, then the co-factors of a circuit or program are captured by assigning various combinations of these control inputs. The co-factors may then be matched using known functional matching techniques. For example, assuming that the signals $S_1$ and $S_0$ are identified as control signals in FIG. 2A, then assigning various logic values to these control inputs yields a number of co-factors which can then be matched using existing techniques. The equation given above describing circuit 231 is as follows:

$$Out=En\cdot[(In_0S_1'S_0') \text{ or } (In_1S_1'S_0) \text{ or } (In_2S_1S_0') \text{ or } (In_3S_1S_0)],$$

When combinations of control inputs are assigned to the values of $S_1$ and $S_0$, the following co-factors result:

| Assigned Values of $S_1$ | Assigned Values of $S_0$ | Captured co-factors |
|---|---|---|
| 0 | 0 | Out = En · $In_0$ |
| 0 | 1 | Out = En · $In_1$ |
| 1 | 0 | Out = En · $In_2$ |
| 1 | 1 | Out = En · $In_3$ |

Each of the co-factors in the above case reduces circuit 231 of FIG. 2A down to a single AND gate structure each with the common input driven by input En. These simple enable-driven AND gate structures then become candidates for matching, and may subsequently be matched to one or more templates, or one or more other candidates for matching so identified in an integrated circuit design or software program.

This matching may be performed using any known functional matching techniques. Some embodiments match subsets with different descriptions but very similar function without requiring the function to be identical. Thus, approximate functional matching may be performed on one or more identified matching candidates according to the principles outlined in this description. These identified matching candidates may then be evaluated and possibly ranked based on overall resource savings they could provide to the circuit or program.

Figure 6:
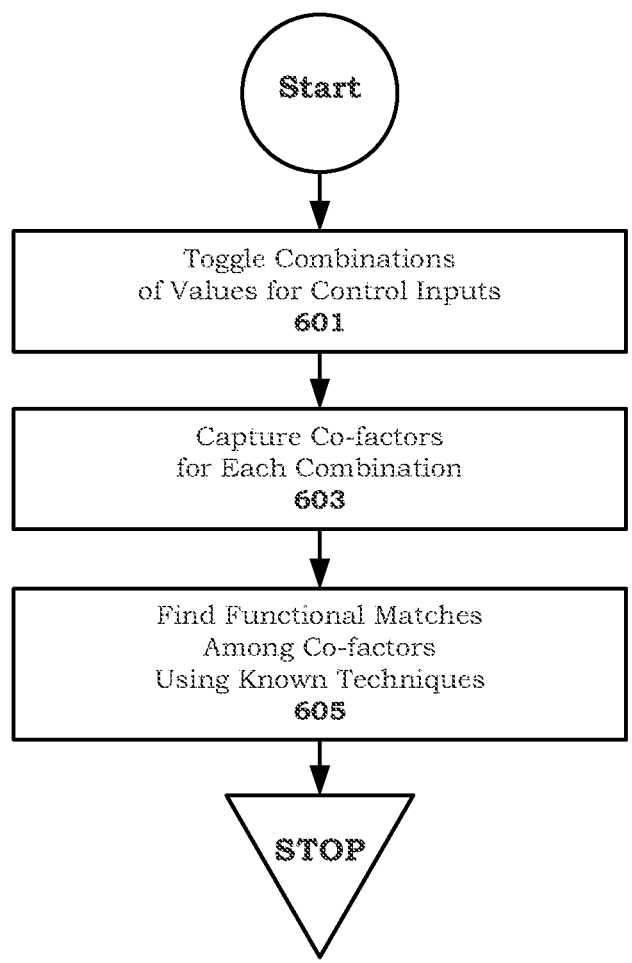
FIG. 6 illustrates a method of approximate functional matching according to an exemplary embodiment of the invention.

FIG. 6 illustrates a method of performing approximated functional matching according to an exemplary embodiment of the invention. As discussed above, combinations of values of the identified control inputs are assigned (operation 601) and co-factors are captured for each of the assigned combinations (operation 603). Then functional matches are found among the co-factors using known matching techniques (operation 605). These techniques may be used with integrated circuits and software programs. For example, a subset of the software program can be a function (using C++ syntax) such as:

```
int max (int a, int b)
{
    return (a>b ? a : b);
}
Or
double max (double a, double b)
{
    return (a>b ? a : b);
}
```

For these simple programs, a "control input" would be the type used (or a collection of types). A super-function that explicitly exposes the type as a parameter would be as follows:

```
template<class T>
T max (T a, T b)
{
    return (a>b ? a : b);
}
```

Not only functions, but also fragments of functions can be eligible subsets. For example:

```
for (int i=0; i++; i<N)
{
    c[i]=a[i]+gamma*b[i];
}
would match
    for (int j=0; j++; j<M)
    {
        z[i] =x[i] +delta*y[i];
    }
```

Once the matching candidates are identified, known matching techniques may be applied. One technique is to conglomerate adjacent matches into clusters to reduce multiplexing overhead. For example, for the subsets represented by the equations (A+B)*C and (X+Y)*Z, the adders and the multipliers would be identified as matching candidates (even though the inputs are different). If each of the subsets is multiplexed onto itself, then two (2) multiplexors and two (2) demultiplexors would be required. However, if the matches are conglomerated into an adder-multiplier supermodule, then only one (1) multiplexor is required.

Another matching technique is to match functional equivalents with different internal structure. For example, the subsets represented by the equations (A+B*C) and (A*C+B*C) are functionally equivalent and may be matched as so even though they have different structure. Similarly, structural equivalence can often be relaxed by several gates which can then be multiplexed. For example, an unmatched inverter can be turned into an XOR gate controlled by an identified control input such as a thread_id.

Moreover, different modules can be generalized into a configurable supermodule of approximately the same size, e.g., addition, subtraction and less-than comparisons can be performed by one supermodule with two (2) select lines. Instead of using a separate adder and subtractor in this example, a standard adder-subtractor may be used with a configuration bit. Consider building an adder-subtractor from an adder and a subtractor. Once a 4-bit adder-subtractor is built by approximate functional matching, it is known that its add-or-subtract configuration bit is control, and everything else is data. So, when approximate functional matching is performed bit-by-bit, the two cases of "add" and "subtract" are considered with two new data bits which can be used for co-factoring. This gives three control signals and eight cofactors. Since all cofactors must match, one additional bit of the result can be computed by finding only several gates.

If many pairs of co-factors match, they can be multiplexed to build up a supermodule that can act as a constituent component to be matched with other supermodules (depending on select bits). The supermodule may then be optimized. For example, the expressions (sel ? A+B:A-B) and (sel ? A-B:A+B) can be viewed as multiplexors selecting between values of A+B and A-B computed by an adder and a subtractor. But, they do not match exactly because they differ by an inverter on the select bit. This can be remedied using a supermodule with an XOR gate replacing the inverter controlled by thread_id (0 or 1). For thread_id 0, the circuit can be modeled by a wire, and for thread_id 1, the circuit is modeled as an inverter. This can be generalized by considering the multiplexer functional modules (x ? a:b) and (x ? b:a) as approximate matches, and their supermodule f(a, b, x, sel) can be simplified to (x XOR sel ? a:b).

A second method can be illustrated by the equivalence (sel ? a+b: a)~(a+b & sel). This function is a ternary operator meaning, if (sel) then return a+b, else return a. This can be approximated by the expression (a+b & sel) as follows:

if sel==0, then $b$ & sel=0, and $a+b$ & sel=$a$

Generally, for small enough co-factors, say C0 and C1, approximate functional matching is performed by synthesizing the function f(x, sel)=$C_{sel}$(x) for every sel=0, 1. Consider two cases for sel==0 and sel==1 as follows:

$f(x,0)=C0(x)$ and $f(x,1)=C1(x)$.

So, f(x, sel) functionally multiplexes C0 and C1 onto the same function. In other words, f(x, sel)=(sel ? C1(x): C1(x)), which is the expression above.

To find supermodules for multiple-output circuits or software, especially arithmetics, the outputs may be ordered by the size of their support (inputs). Then the inputs may be ordered based on how many (and which) outputs they control. At least certain embodiments may then perform approximate functional matching on a few (k=4) least significant bits (LSBs). The LSBs of each of the matching candidates may be viewed as control signals and the approximate functional matching is performed as before by toggling the combinations of control inputs yielding various co-factors which may then be matched. If an acceptable supermodule is found, it may be extended in the above fashion by taking one or more LSBs of the supermodule and once again viewing these bits as control. This iteration may be performed until all inputs have been considered. However, this is given by way of illustration and not limitation as any number of inputs may be considered within the scope of this description. At each iteration, control signals are both select bit(s) of the supermodule, and the next bit(s) in the ordering. New logic (often 1-3 gates) can be found by exhaustive search or by transduction.

A particular extension of this method allows the processing of a large number of subsets and/or templates without considering all pairs. This is accomplished by using a hash function of the co-factors so as to characterize each subset by a vector of numbers. One way to perform hashing of the co-factors is to serialize their representations. Co-factors may be converted into character strings or bit-strings, and then the strings may be hashed using standard techniques. In at least certain embodiments, the vectors can then be subjected to another hash function referred to as a "locality-sensitive hash function" to arrive at a single number such that similar vectors produce similar numbers. Basically, we hash certain hash values of the co-factors, using different hash functions. Then, subsets and templates that would form approximate matches are likely to produce the same final numbers (i.e., hash into the same bucket so to speak), which allows matching co-factors to be identified efficiently without having to consider all pairs.

For example, if there are 16 co-factors and 32 co-factors, then considering all pairs would require 16*32 operations. Instead, the hash functions of the 16 and 32 co-factors may be computed and the resulting 48 values sorted into sets. This puts equal values next to each other, so that only co-factors with equal hash values are considered. If there are no equal hash values, then there will be no matches in this embodiment.

In some embodiments, a functional matching criterion can be evaluated by connecting two subsets via multiplexors and then performing known optimizations, i.e. resource sharing, factoring, constant propagation, merging equivalent selector/multiplexor inputs. The result can then be evaluated on a number of criteria such as area, timing, power relative to the same criteria for the original subsets to form a functional matching criterion.

Further, the multiplexed subsets can be converted to various functional forms for Boolean or arithmetic functions, followed by comparing characteristics of the forms such as number of nodes in graph based functional forms.

Pairs of co-factors can also be compared by connecting them via select logic and applying optimizations. The result can then be compared to the original co-factors on a variety of criteria. Again, this comparison can be based on converting the result to a functional form and measuring properties of the functional form relative to the properties of the functional forms of the co-factors.

In some embodiments, supermodules are constructed by connecting subsets via select logic and then performing optimizations to reduce the targeted criteria. If the resulting supermodule is similar in cost to the original subsets then it can potentially replace the original subsets at a savings.

Another extension of the invention is to use parametric matches and closely-related operations when capturing co-factors, such as matching an 8-bit multiplier to a 10-bit multiplier (because the latter can also implement the former) or matching an 8-bit adder to a 10-bit subtractor (for the same reason). In such cases, the more general component is considered.

In this manner, a method and apparatus for approximate functional matching in electronic systems is described. At least certain embodiments identify approximate functional matches not found by previously existing techniques. These embodiments simultaneously remove the restrictions of exact functional matching and structural matching taught in the prior art by matching one or more subsets of an integrated circuit design or software program (hereinafter referred to collectively as "subsets") to one or more templates, or by matching two or more subsets to each other. Some embodiments match subsets with different descriptions but very similar function, without requiring the function to be identical. By separating the overall function of a subset into a plurality (such as an ordered set or vector) of such co-factors, embodiments can leverage other functional matching techniques, including known techniques for exact functional matching. In at least certain embodiments, this process is referred to as approximate functional matching, since functional matching may be performed on matching candidates (subsets) with similar, but not exact functionality. If multiple or all co-factors match for two or more subsets or for one or more subsets and a template, then an approximate match is declared. This can lead to a multitude of benefits in various applications, including better utilization of available resources, smaller chip size, smaller manufacturing cost, and smaller power consumption.

In at least certain embodiments, the foregoing methods and apparatuses described herein may be used in conjunction with any data processing system.

FIG. 7 shows one example of a typical data processing system, such as data processing system 700, which may be used with the present invention. Note that while FIG. 7 illustrates various components of a data processing system, it is not intended to represent any particular architecture or manner of interconnecting the components as such details are not germane to the present invention. It will also be appreciated that network computers and other data processing systems which have fewer components or perhaps more components may also be used. The data processing system of FIG. 7 may, for example, be a workstation, or a personal computer (PC) running a Windows operating system, or an Apple Macintosh computer.

As shown in FIG. 7, the data processing system 701 includes a system bus 702 which is coupled to a microprocessor 703, a ROM 707, a volatile RAM 705, and a non-volatile memory 706. The microprocessor 703, which may be a processor designed to execute any instruction set, is coupled to cache memory 704 as shown in the example of FIG. 7. The system bus 702 interconnects these various components together and also interconnects components 703, 707, 705, and 706 to a display controller and display device 708, and to peripheral devices such as input/output (I/O) devices 710, such as keyboards, modems, network interfaces, printers, scanners, video cameras and other devices which are well known in the art. Typically, the I/O devices 710 are coupled to the system bus 702 through input/output controllers 709. The volatile RAM 705 is typically implemented as dynamic RAM (DRAM) which requires power continually in order to refresh or maintain the data in the memory. The non-volatile memory 706 is typically a magnetic hard drive or a magnetic optical drive or an optical drive or a DVD RAM or other type of memory systems which maintain data even after power is removed from the system. Typically, the non-volatile memory 706 will also be a random access memory although this is not required. While FIG. 7 shows that the non-volatile memory 706 is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface (not shown). The system bus 702 may include one or more buses connected to each other through various bridges, controllers and/or adapters (not shown) as is well known in the art. In one embodiment the I/O controller 709 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software, hardware, firmware, or in combination thereof. That is, the techniques may be carried out in a computer system or other data processing system in response to its processor, such as a microprocessor, executing sequences of instructions contained in a memory, such as ROM 707, volatile RAM 705, non-volatile memory 706, cache 704 or a remote storage device (not shown). In various embodiments, hardwired circuitry may be used in combination with software instructions to implement the present invention. Thus, the techniques are not limited to any specific combination of hardware circuitry and software or to any particular source for the instructions executed by the data processing system 700. In addition, throughout this description, various functions and operations are described as being performed by or caused by software code to simplify description. However, those skilled in the art will recognize that what is meant by such expressions is that the functions result from execution of code by a processor, such as the microprocessor 703.

A machine readable medium can be used to store software and data which when executed by the data processing system 700 causes the system to perform various methods of the present invention. This executable software and data may be stored in various places including for example ROM 707, volatile RAM 705, non-volatile memory 706, and/or cache 704 as shown in FIG. 7. Portions of this software and/or data may be stored in any one of these storage devices.

The invention also relates to apparatus for performing the operations herein. This apparatus may be specially constructed for the required purposes, or it may comprise a general purpose computer selectively activated or reconfigured by a computer program stored in the computer. Such a computer program may be stored or transmitted in a machine-readable medium. A machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media such as, but not limited to, a machine-readable storage medium (e.g., any type of disk including floppy disks, optical disks, CD-ROMs, and magnetic-optical disks, read-only memories (ROMs), random access memories (RAMs), EPROMs, EEPROMs, flash memory, magnetic or optical cards, or any type of media suitable for storing electronic instructions), or a machine-readable transmission medium such as, but not limited to, any type of electrical, optical, acoustical or other form of propagated signals (e.g., carrier waves, infrared signals, digital signals, etc.).

Additionally, it will be understood that the various embodiments described herein may be implemented with data processing systems which have more or fewer components than system 1600; for example, such data processing systems may be a cellular telephone or a personal digital assistant (PDA) or an entertainment system or a media player (e.g., an iPod) or a consumer electronic device, etc., each of which can be used to implement one or more of the embodiments of the invention.

Throughout the foregoing specification, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. When a particular feature, structure, or characteristic is described in connection with an embodiment, it is submitted that it is within the knowledge of one skilled in the art to bring about such a feature, structure, or characteristic in connection with other embodiments whether or not explicitly described. Various changes may be made in the structure and embodiments shown herein without departing from the principles of the invention. Further, features of the embodiments shown in various figures may be employed in combination with embodiments shown in other figures.

In the description as set forth above and claims, the terms "coupled" and "connected," along with their derivatives, may be used. It should be understood that these terms are not intended to be synonymous with each other. Rather, in particular embodiments, "connected" is used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some portions of the detailed description as set forth above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion as set forth above, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention also relates to apparatus for performing the operations herein. This apparatus may be specially constructed for the required purposes, or it may comprise a general purpose computer selectively activated or reconfigured by a computer program stored in the computer. Such a computer program may be stored or transmitted in a machine-readable medium, such as, but is not limited to, a machine-readable storage medium (e.g., any type of disk including floppy disks, optical disks, CD-ROMs, and magnetic-optical disks, read-only memories (ROMs), random access memories (RAMs), EPROMs, EEPROMs, flash memory, magnetic or optical cards, or any type of media suitable for storing electronic instructions), or a machine-readable transmission medium such as, but not limited to, any type of electrical, optical, acoustical or other form of propagated signals (e.g., carrier waves, infrared signals, digital signals, etc.).

The algorithms and displays presented herein are not inherently related to any particular computer system or other apparatus. Various general purpose systems may be used with programs in accordance with the teachings herein, or it may prove convenient to construct more specialized apparatuses to perform the method operations. The structure for a variety of these systems appears from the description above. In addition, the invention is not described with reference to any particular programming language. It will be appreciated that a variety of programming languages may be used to implement the teachings of the invention as described herein.

Embodiments of the invention may include various operations as set forth above or fewer operations or more operations or operations in an order which is different from the order described herein. The operations may be embodied in machine-executable instructions which cause a general-purpose or special-purpose processor to perform certain operations. Alternatively, these operations may be performed by specific hardware components that contain hardwired logic for performing the operations, or by any combination of programmed computer components and custom hardware components.

Throughout the foregoing description, for the purposes of explanation, numerous specific details were set forth in order to provide a thorough understanding of the invention. It will be apparent, however, to one skilled in the art that the invention may be practiced without some of these specific details. Accordingly, the scope and spirit of the invention should be judged in terms of the claims which follow as well as the legal equivalents thereof.

What is claimed is:

1. A method to update a description of an integrated circuit design or software program, the method comprising:
   determining, using a processor, whether an input of one or more subsets of the description or software program is a control input by
      assigning combinations of logic values to one or more side inputs of the one or more subsets of the description or software program
      determining a first number of outputs sensitized by a logic transition of the input for each combination of values of the one or more side inputs,
      determining if the first number is greater than a predetermined number, and identifying the input as a control input if the first number of outputs sensitized by the input is greater than the predetermined number;
   determining a first plurality of co-factors for the one or more subsets of the description or software program, each co-factor determined by toggling combinations of values for the control inputs;
   identifying matches in the description or software program or a template by a comparison of co-factors;
   determining one or more updated subsets based on one or more matches; and
   updating the description or software program with the updated subset.

2. The method of claim 1, wherein the one or more subsets of the description or software program is a function or a fragment of a function.

3. The method of claim 1, further comprising
   determining the input as a data input, if the first number of outputs sensitized by the input is not greater than the predetermined number.

4. The method of claim 2, wherein a first control input of the function or fragment is a type used or a collection of types.

5. The method of claim 1, the determining one or more updated subsets further comprising combining one or more matches into a supermodule.

6. The method of claim 1, the determining one or more updated subsets further comprising replacing one or more matches with a different internal structure.

7. The method of claim 1, wherein the input is part of a demultiplexor, an adder, a subtractor, or a combination thereof.

8. The method of claim 1, further comprising ranking the control inputs.

9. The method of claim 1, wherein the predetermined number is determined by assessing which outputs are sensitized by the logic transition.

10. A non-transitory computer-readable storage medium that provides instruction, which when executed by a computer, performs a method to update a description of an integrated circuit design or software program, the method comprising:
    determining, using a processor, whether an input of one or more subsets of the description or software program is a control input by
       assigning combinations of logic values to one or more side inputs of the one or more subsets of the description or software program
       determining a first number of outputs sensitized by a logic transition of the input for each combination of values of the one or more side inputs,
       determining if the first number is greater than a predetermined number, and identifying the input as a control input if the first number of outputs sensitized by the input is greater than the predetermined number;
    determining a first plurality of co-factors for the one or more subsets of the description or software program, each co-factor determined by toggling combinations of values for the control inputs;
    identifying matches in the description or software program or a template by a comparison of co-factors;
    determining one or more updated subsets based on one or more matches; and
    updating the description or software program with the updated subset.

11. The non-transitory computer-readable storage medium of claim 10,
    wherein the one or more subsets of the description or software program is a function or a fragment of a function.

12. The non-transitory computer-readable storage medium of claim 10, wherein the method further comprises
    determining the input as a data input, if the first number of outputs sensitized by the input is not greater than the predetermined number.

13. The non-transitory computer-readable storage medium of claim 11, wherein a first control input of the function or fragment is a type used or a collection of types.

14. The non-transitory computer-readable storage medium of claim 10, the determining one or more updated subsets further comprises combining one or more matches into a supermodule.

15. The non-transitory computer-readable storage medium of claim 10,
    wherein the predetermined number is determined by assessing which outputs are sensitized by the logic transition.

16. A data processing system comprising:
    a memory; and
    a processor coupled to the memory, the processor configured to, upon receipt of a description of an integrated circuit design or software program, determine whether an input of one or more subsets of the description or software program is a control input by assigning combinations of logic values to one or more side inputs of the one or more subsets of the description or software program, determine a first number of outputs sensitized by a logic transition of the input for each combination of values of the one or more side inputs, determine if the first number is greater than a predetermined number, and identify the input as a control input if the first number of outputs sensitized by the input is greater than the predetermined number;

the processor further configured to determine a first plurality of co-factors for the one or more subsets of the description or software program, each co-factor determined by toggling combinations of values for the control inputs; identify matches in the description or software program or a template by a comparison of co-factors; determine one or more updated subsets based on one or more matches; and update the description or software program with the updated subset.

17. The data processing system of claim 16, wherein the one or more subsets of the description or software program is a function or a fragment of a function.

18. The data processing system of claim 16, wherein the processor is further configured to determined the input as a data input, if the first number of outputs sensitized by the input is greater than the predetermined number.

19. The data processing system of claim 17, wherein a first control input of the function or fragment is a type used or a collection of types.

20. The data processing system of claim 18, wherein
the processor is further configured to determined special-case resulting from propagating logic values.

21. The data processing system of claim 20, wherein the processor is further configured to determine whether the special-case circuits are smaller than an original circuit.

22. The data processing system of claim 16, wherein the input is part of a demultiplexor , an adder, a subtractor, or a combination thereof.

23. The data processing system of claim 16, wherein the processor is further configured to rank the input.

* * * * *